US012733261B2

(12) United States Patent
Xie et al.

(10) Patent No.: US 12,733,261 B2
(45) Date of Patent: Sep. 8, 2026

(54) STACKED FET WITH LOCAL CONTACT

(71) Applicant: INTERNATIONAL BUSINESS MACHINES CORPORATION, Armonk, NY (US)

(72) Inventors: Ruilong Xie, Niskayuna, NY (US); James P. Mazza, Saratoga Springs, NY (US); Shahrukh Khan, Sandy Hook, CT (US); Iqbal Rashid Saraf, Glenmont, NY (US); Biswanath Senapati, Albany, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 460 days.

(21) Appl. No.: 18/453,285

(22) Filed: Aug. 21, 2023

(65) Prior Publication Data

US 2025/0072113 A1 Feb. 27, 2025

(51) Int. Cl.

| | |
|---|---|
| ***H10D 86/60*** | (2025.01) |
| ***H10D 86/01*** | (2026.01) |
| ***H10D 86/40*** | (2025.01) |

(52) U.S. Cl.

CPC ......... *H10D 86/60* (2025.01); *H10D 86/0214* (2025.01); *H10D 86/441* (2025.01)

(58) Field of Classification Search

CPC .. H10D 86/60; H10D 86/0214; H10D 86/441; H10D 30/0198; H10D 64/251; H10D 84/0149; H10D 84/832; H10D 84/0153; H10D 30/501; H10D 30/6735; H10D 30/6757; H10D 88/00; B82Y 10/00; H01L 21/283; H01L 21/76805; H01L 21/76897; H01L 23/5286; H10P 14/40; H10W 20/069; H10W 20/083; H10W 20/427; H10W 20/481; H10W 20/0696

See application file for complete search history.

(56) References Cited

U.S. PATENT DOCUMENTS

| | | | | |
|---|---|---|---|---|
| 10,192,819 | B1 | 1/2019 | Chanemougame | |
| 10,192,867 | B1 | 1/2019 | Frougier | |
| 10,510,622 | B1 | 12/2019 | Frougier | |
| 10,607,938 | B1 | 3/2020 | Rubin | |
| 11,201,148 | B2 | 12/2021 | Liebmann | |
| 11,444,018 | B2 | 9/2022 | Wu | |
| 12,279,452 | B2 * | 4/2025 | Cheng | H10D 84/85 |
| 2020/0294998 | A1 | 9/2020 | Lilak | |
| 2021/0407999 | A1 | 12/2021 | Huang | |
| 2022/0230961 | A1 | 7/2022 | Park | |
| 2022/0238713 | A1 * | 7/2022 | Lee | H10D 86/0214 |
| 2023/0046885 | A1 | 2/2023 | Hwang | |
| 2024/0404950 | A1 * | 12/2024 | Xie | H10D 30/43 |
| 2025/0194104 | A1 * | 6/2025 | Dutta | H10B 61/22 |
| 2025/0203974 | A1 * | 6/2025 | Lanzillo | H10D 88/01 |

* cited by examiner

*Primary Examiner* — Douglas W Owens

(74) *Attorney, Agent, or Firm* — Scully, Scott, Murphy & Presser, P.C.; Kristofer Haggerty

(57) ABSTRACT

A semiconductor device includes a first source/drain region, a first contact over the first source/drain region, a second source/drain region, and a lateral contact connecting the second source/drain region to a back end of line (BEOL). Portions of the first contact are recessed, and the lateral contact overlaps with the recessed portions of the first contact. The first source/drain region is formed over the second source/drain region.

18 Claims, 21 Drawing Sheets

200
OPL 430
Y2

200
Horizontally extended Portion 412
Recessed Portions 410
Vertically Extended Portions 414
Y1

Un-recessed Portions 420
200
X 200
200
200
X
Y1
Y2

STACKED FET WITH LOCAL CONTACT

BACKGROUND

Technical Field

The present disclosure generally relates to transistors and, more particularly, to local contacts in transistors and methods of creation thereof.

Description of the Related Art

Backside contacts provide a way to establish electrical connections with the backside or substrate of a transistor and enable efficient signal transmission, improved device performance, and enhanced manufacturing processes. In a typical transistor structure, the backside or substrate region is distinct from the active region where the transistor's channel and source/drain regions are located. The electrical connection established by the backside contacts provides a pathway for electrical signals, current, and voltage to flow, allowing communication between different components of an integrated circuit.

SUMMARY

According to an embodiment, a semiconductor device includes a first source/drain region, a first contact over the first source/drain region, a second source/drain region, and a lateral contact connecting the second source/drain region to a back end of line (BEOL). Portions of the first contact are recessed, and the lateral contact overlaps with the recessed portions of the first contact. The first source/drain region is formed over the second source/drain region.

In some embodiments, which can be combined with the previous embodiment, the lateral contact is located above the first and second source/drain regions.

In some embodiments, which can be combined with one or more previous embodiments, the first source/drain region is located on a first transistor and the second source/drain region is located on a second transistor. The first transistor is stacked over the second transistor.

In some embodiments, which can be combined with one or more previous embodiments, the second contact can include a first portion over the second source/drain region, and a second portion connecting the first portion to the lateral contact.

In some embodiments, which can be combined with one or more previous embodiments, the semiconductor device can include a gate contact connecting a gate region to the BEOL, and a dielectric isolation layer covering the gate contact.

In some embodiments, which can be combined with one or more previous embodiments, a location of the lateral contact is offset from a centerline of the second source/drain region away from the gate region.

In some embodiments, which can be combined with one or more previous embodiments, the gate contact passes through the lateral contact and un-recessed portions of the first contact. The dielectric isolation layer isolates the gate contact from direct contact with the lateral contact and the first contact. A portion of the dielectric isolation layer is connected to the lateral contact, and the first contact and the second contact are isolated by an interlayer dielectric (ILD).

According to another embodiment, a method for forming a semiconductor device can include forming a first source/drain region, forming first contact over the first source/drain region, forming a second source/drain region, and forming a lateral contact connecting the second source/drain region to a back end of line (BEOL). Portions of the first contact are recessed, and the lateral contact overlaps with the recessed portions of the first contact. The first source/drain region is formed over the second source/drain region.

In some embodiments, which can be combined with the previous embodiment, the lateral contact is located above the first and second source/drain regions.

In some embodiments, which can be combined with one or more previous embodiments, the first source/drain region is located on a first transistor and the second source/drain region is located on a second transistor, and the first transistor is stacked over the second transistor.

In some embodiments, which can be combined with one or more previous embodiments, forming the second contact further includes forming a first portion over the second source/drain region, and forming a second portion connecting the first portion to the lateral contact.

In some embodiments, which can be combined with one or more previous embodiments, the method can include forming a gate contact connecting a gate region to the BEOL, and forming a dielectric isolation layer covering the gate contact.

In some embodiments, which can be combined with one or more previous embodiments, a location of the lateral contact is offset from a centerline of the second source/drain region away from the gate region, and the gate contact passes through the lateral contact and un-recessed portions of the first contact.

In some embodiments, which can be combined with one or more previous embodiments, the method includes isolating, by the dielectric isolation layer, the gate contact from direct contact with the lateral contact and the first contact, and connecting a portion of the dielectric isolation layer to the lateral contact, and isolating the first contact and the second contact by an interlayer dielectric (ILD).

According to yet another embodiment, a semiconductor device includes a source/drain contact connecting a source/drain region to a back end of line (BEOL), a gate contact connecting a gate region to the BEOL, and a lateral contact. The gate contact is isolated from direct contact with the lateral contact through a dielectric isolation layer formed over the gate contact.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figures 1A, 1B, 1C:
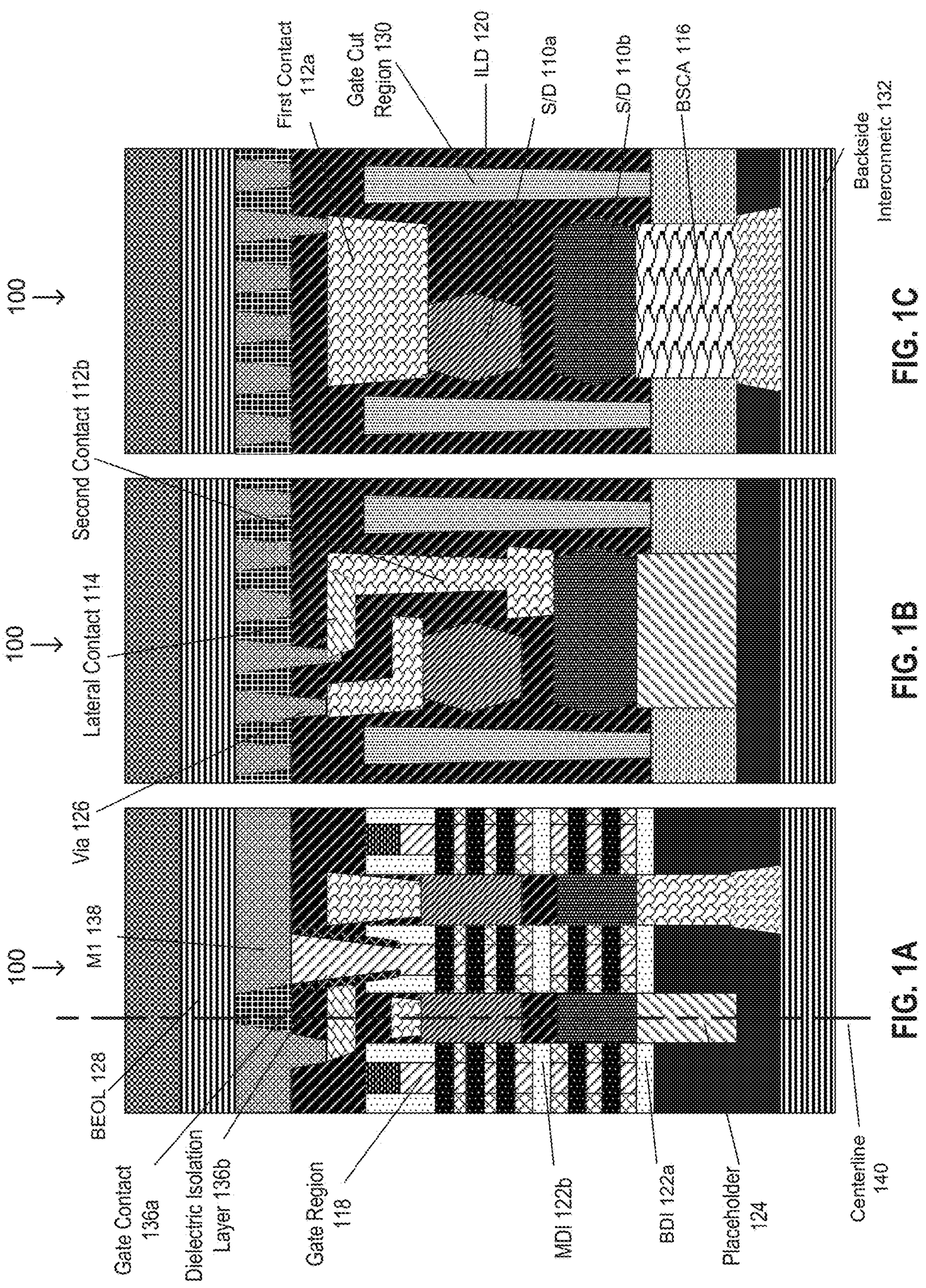
FIGS. 1A-1C illustrate a semiconductor device, in accordance with some embodiments.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

Although this detailed description includes examples of how embodiments of the disclosure can be implemented to form an exemplary semiconductor device with stacked FETs, implementation of the teachings recited herein are not necessarily limited to a particular type of FET structure or combination of materials depicted or described. Rather, embodiments of the present disclosure are capable of being implemented in conjunction with other transistor types or materials, now known or later developed, wherein it is desirable to reduce capacitance between the top spruce/drain region, bottom source/drain region, and/or the gate of a stacked transistor.

According to an embodiment, a semiconductor device includes a first source/drain region, a first contact over the first source/drain region, a second source/drain region, and a lateral contact connecting the second source/drain region to a back end of line (BEOL). Portions of the first contact are recessed, and the lateral contact overlaps with the recessed portions of the first contact. Recessing portions of the first contact can increase the distance between the lateral contact and the first source/drain contact, which can decrease the risk of lateral contact/first source/drain contact shorting.

In some embodiments, which can be combined with one or more previous embodiments, the lateral contact is located above the first and second source/drain regions. Thus, the lateral contact can be closer to the BEOL than the first and second source/drain regions.

In some embodiments, which can be combined with one or more previous embodiments, the first source/drain region is located on a first transistor and the second source/drain region is located on a second transistor, and the first transistor is stacked over the second transistor. Thus, the semiconductor device can be used to connect stacked transistors to a common BEOL.

In some embodiments, which can be combined with one or more previous embodiments, the second contact further includes a first portion over the second source/drain region, and a second portion connecting the first portion to the lateral contact. The second portion includes a smaller thickness compared to the first portion. Thus, the second portion requires less space, hence, decreasing the risk of shorting.

In some embodiments, which can be combined with one or more previous embodiments, the semiconductor device can include a gate contact connecting a gate region to the BEOL, and a dielectric isolation layer covering the gate contact.

In some embodiments, which can be combined with one or more previous embodiments, a location of the lateral contact is offset from a centerline of the second source/drain region away from the gate region. Thus, the risk of metal shorting is decreased.

In some embodiments, which can be combined with one or more previous embodiments, the gate contact passes through the lateral contact and un-recessed portions of the first contact. In some embodiments, which can be combined with one or more previous embodiments, the dielectric isolation layer isolates the gate contact from direct contact with the lateral contact and the first contact. Thus, the gate contact is not in direct contact with the lateral contact and the first contact.

In some embodiments, which can be combined with one or more previous embodiments, a portion of the dielectric isolation layer is connected to the lateral contact. Thus, direct contact between the gate and lateral contacts are avoided, and only the lateral contact and the dielectric isolation layer are connected.

In some embodiments, which can be combined with one or more previous embodiments, the first contact and the second contact are isolated by an interlayer dielectric (ILD). Thus, the first and second contacts are not in direct contact, which decreases the risk of shorting.

According to another embodiment, a method for forming a semiconductor device can include forming a first source/drain region, forming first contact over the first source/drain region, forming a second source/drain region, and forming a lateral contact connecting the second source/drain region to a back end of line (BEOL). Portions of the first contact are recessed, and the lateral contact overlaps with the recessed portions of the first contact. Recessing portions of the first contact can increase the distance between the lateral contact and the first source/drain contact, which can decrease the risk of lateral contact/first source/drain contact shorting.

In some embodiments, which can be combined with one or more previous embodiments, the lateral contact is located above the first and second source/drain regions. Thus, the lateral contact can be closer to the BEOL than the first and second source/drain regions.

In some embodiments, which can be combined with one or more previous embodiments, the first source/drain region is located on a first transistor and the second source/drain region is located on a second transistor, and the first transistor is stacked over the second transistor. Thus, the semiconductor device can be used to connect stacked transistors to a common BEOL.

In some embodiments, which can be combined with one or more previous embodiments, forming the second contact further includes forming a first portion over the second source/drain region, and forming a second portion connecting the first portion to the lateral contact. The second portion includes a smaller thickness compared to the first portion. Thus, the second portion requires less space, hence, decreasing the risk of shorting.

In some embodiments, which can be combined with one or more previous embodiments, the method can include forming a gate contact connecting a gate region to the BEO, and forming a dielectric isolation layer covering the gate contact.

In some embodiments, which can be combined with one or more previous embodiments, a location of the lateral contact is offset from a centerline of the second source/drain region away from the gate region. Thus, the risk of metal shorting is decreased.

In some embodiments, which can be combined with one or more previous embodiments, the method includes passing the gate contact through the lateral contact and un-recessed portions of the first contact. In some embodiments, which can be combined with one or more previous embodiments, the method includes isolating, by a dielectric layer, the gate contact from direct contact with the lateral contact and first contact. Thus, the gate contact is not in direct contact with the lateral contact and the first contact.

In some embodiments, which can be combined with one or more previous embodiments, the method includes connecting a portion of the dielectric isolation layer to the lateral contact, and isolating the first contact and the second contact by an interlayer dielectric (ILD). Thus, the first and second contacts are not in direct contact, which decreases the risk of shorting.

According to yet another embodiment, a semiconductor device can include a source/drain contact connecting a source/drain region to a back end of line (BEOL), a gate contact connecting a gate region to the BEOL, and a lateral contact. The gate contact is isolated from direct contact with the lateral contact through a dielectric isolation layer formed over the gate contact. Thus, the gate contact and the lateral contact are not in direct contact with each other, which can avoid shorting.

The concepts herein relate to stacked field-effect transistor (FET), which are fundamental electronic devices that have revolutionized the field of electronics and how various elements of the transistors are electrically connected. The stacked FET is a type of transistor architecture that offers improved functionality and benefits in integrated circuit (IC) design. The stacked FET involves stacking multiple FETs on top of each other, allowing for enhanced performance and increased integration density.

Pin access refers to the method or ability to access individual FETs in the stacked FET, for example, for testing or debugging purposes. The series arrangement of stacked FETs can make it difficult to interact with individual FETs. Unlike standard configuration, in a typical stacked FET, the first level metal layer, M1 track, for the bottom source/drain can be very limited, due to the shadowing effect of the top source/drain.

Recently, using local interconnects has attracted some attention, since the interconnect can facilitate connecting the semiconductor elements to the BEOL. However, using local interconnects in a stacked FET configuration also presents challenges. These challenges include the increased complexity of the design and fabrication process, the potential for signal integrity issues due to the close proximity of the interconnects, and the possibility of local interconnect shorting to nearby contact structures, especially gate contact over active regions.

To tackle the above-mentioned problems, disclosed is a semiconductor device with stacked FETs that utilize a combination of a local interconnect ("a lateral contact" hereinafter) and a recessed source/drain contact that can avoid source/drain contact-lateral contact shorting. By recessing portions of the source/drain contact, the overall size of the source/drain contact can be decreased, which can decrease the risk of lateral contact-source/drain contact shorting.

Accordingly, the teachings herein provide methods and systems of semiconductor device formation with lateral contact and a recessed source/drain contact. The techniques described herein may be implemented in a number of ways. Example implementations are provided below with reference to the following figures.

Example Semiconductor Device with Lateral Contact Structure

Figure 1D:
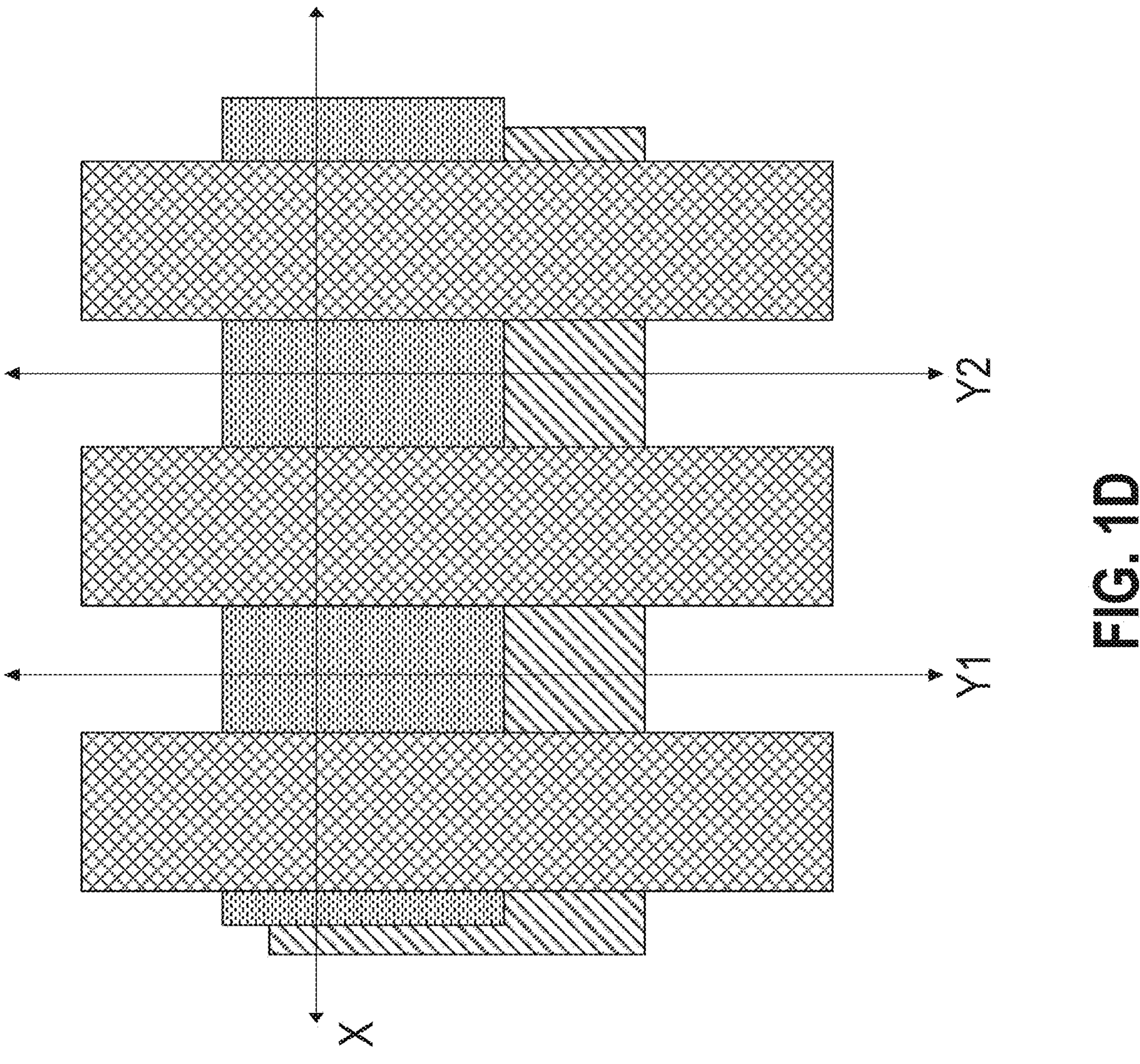
FIG. 1D depicts the side-view sections from which the semiconductor device is illustrated.

Reference now is made to FIGS. 1A-1C, which are simplified cross-section views of a semiconductor device 100, consistent with an illustrative embodiment. FIG. 1D depicts a top view of the semiconductor device 100. For example, FIG. 1A, and other figures denoted by A, illustrate an X section of the semiconductor device, FIG. 1B, and other figures denoted by B, illustrate a Y1 section of the semiconductor device and FIG. 1C, and other figures denoted by C, illustrate a Y2 section of the semiconductor device.

In various embodiments, the semiconductor device 100 is a stacked FET that leverages the vertical dimension of the semiconductor device 100 to increase the number of active devices within a given area. This way, instead of relying solely on lateral scaling, where semiconductor devices are shrunk in size on the semiconductor substrate, stacking FETs vertically can enable the incorporation of multiple layers of semiconductor devices. This arrangement enables more complex circuitry and advanced functionality.

In several embodiments, the stacked FET structure of the semiconductor device 100 can enable higher integration densities by utilizing the vertical dimension of the semiconductor device 100. In such embodiments, instead of relying solely on lateral scaling, which has its limits, stacking FETs on the semiconductor device 100 allows for increased transistor count within a given chip area. This increased transistor count enables the integration of more complex circuits, larger memory arrays, and other functional blocks, enhancing the capabilities of the semiconductor device 100

The disclosed semiconductor device 100 can include first and second source/drain regions 110*a* and 110*b*, a first contact 112*a*, a second contact 112*b*, a lateral contact 114, a backside contact, BSCA, 116, a gate region 118, an inter-layer dielectric, ILD, 120, a bottom dielectric isolation, BDI, 122*a*, a middle dialectic isolation, MDI 122*b*, a placeholder 124, a via 126, a back end of line, BEOL, 128, one or more gate cut regions 130, a backside interconnect 132, a first level metal layer, M1 track, 138, a gate contact 136*a*, and a dielectric isolation layer 136*b*.

In, several embodiments, the first source/drain region 110*a* is located on a first transistor, and the second source/drain region 110*b* is located on a second transistor. In such an embodiment, the first transistor is stacked over the second transistor.

Generally, the first and second source/drain regions 110*a* and 110*b* are two salient components that play relevant roles in the semiconductor device's operation. In various embodiments, the first and second source/drain regions 110*a* and 110*b* are regions within the semiconductor material, e.g., the semiconductor device 100, where the current flows in and out of the semiconductor device 100. The source region is the region through which the majority of charge carriers (e.g., electrons or holes) enter the channel of the semiconductor device and is responsible for providing the current that flows through the semiconductor device. The source region is typically doped to have an excess of charge carriers, creating a region with high carrier concentration. This abundance of carriers allows for the efficient injection of electrons or holes into the channel when a voltage is applied.

The drain region, on the other hand, is the region where the majority of charge carriers exit the channel. The drain region receives the current from the channel and carries the charge away from the transistor. Similar to the source, the drain region is also doped to have a high carrier concentration. The doping profile in the drain region ensures that carriers can easily flow out of the channel and into the drain region. In some embodiments, the first source/drain region 110*a* is located on a first transistor, and the second source/drain region 110*b* is located on a second transistor. The first transistor can be stacked on top of the second transistor to form the semiconductor device 100.

The first contact 112*a*, located over the first source/drain region 110*a*, establishes a connection between the first source/drain region 110*a* and the BEOL 128. The first contact 112*a* ensures efficient electrical routing and connectivity within the semiconductor device 100. The fabrication of the first contact 112*a* can involve lithography and etching processes to define the contact area. The first contact 112*a* can be made using conductive materials such as a silicide liner, e.g., Ni, Ti, NiPt, an adhesion metal layer, e.g., TiN and conductive metal fill material, e.g., tungsten (W), Co, or Ru.

The second contact 112*b*, located over the second source/drain region 110*b*, establishes a connection between the second source/drain region 110*b* and the lateral contact 114. The second contact 112*b* ensures efficient electrical routing and connectivity within the semiconductor device 100. The fabrication of the second contact 112*b* can involve lithography and etching processes to define the contact area. The second contact 112*b* can be made using conductive materials such as a silicide liner, e.g., Ni, Ti, NiPt, an adhesion metal layer, e.g., TiN and conductive metal fill material, e.g., tungsten (W), Co, or Ru.

The lateral contact 114 can create a conducting path or link within the semiconductor device 100 to connect the second source/drain region 110*b* to the M1 tracks 138 that is shadowed by the first source/drain region 110*a*. Such a connection can improve the routing flexibility. Without lateral contact 114, the second source/drain region 110*b* can only access the M1 track 138 directly over the second contact 112*b*. In various embodiments, the lateral contact 114 can be formed in the space that is created as a result of recessing the first contact 112*a*, i.e., the recessed portions 410. That is, the lateral contact 114 can overlap with the recessed portions 410. Recessing portions of the first contact 112*a* can help prevent lateral contact 114 shorting to the first contact 112*a*. In an embodiment as shown in FIG. 1A, the location of the lateral contact 114 can be offset from a centerline 140 of the second source/drain region 110*b* away from the gate region 118.

The BSCA 116 is a region on the backside of the semiconductor device 100 where electrical connections are made. By establishing the electrical contacts, the BSCA 116 ensures the proper functioning of the semiconductor device 100 and facilitates electrical signal transmission.

The BSCA 116 can serve as a contact to backside power supply or signal processing.

In various embodiments, the gate region 118 serves as control elements that regulate the flow of current through the semiconductor device 100. The gate region 118 can be composed of a conductive material. The gate region 118 can control the flow of electric current between the source and drain regions. In some embodiments, by applying a voltage to the gate, the channel region's conductivity is modulated, allowing the semiconductor device 100 to either allow or block the flow of current, which in turn enables the semiconductor device 100 to act as electronic switches or amplifiers. The gate voltage can determine whether the semiconductor device 100 is in an "on" or "off" state. When the gate voltage is below a certain threshold, the semiconductor device 100 is in the "off" state, and the current flow between the source and drain is effectively blocked. On the other hand, when the gate voltage exceeds the threshold, the semiconductor device 100 enters the "on" state, allowing current to flow through the channel region. In addition to acting as a switch, modulating the gate voltage can enable the gate region 118 to control the current flowing through the channel region, resulting in amplified output signals.

In an embodiment, the gate region 118 can enable the implementation of Boolean logic operations, such as AND, OR, and NOT, by controlling the flow of current based on the input voltages. Multiple semiconductor devices can be interconnected to form complex logic circuits, enabling the execution of various computational tasks in digital systems. In some embodiments, the gate region 118, along with other semiconductor device components, can facilitate the miniaturization and integration of electronic circuits. The ability to control the channel region's conductivity through the gate voltage allows for compact and highly efficient circuit designs.

The ILD 120 can be a layer of insulating material to electrically isolate and provide mechanical support between different layers of conducting and active components. In some embodiments, the first and second source/drain regions 110*a* and 110*b* can be isolated by the ILD 120. The ILD 120 can enable efficient signal transmission, reduce crosstalk, and ensure the proper functioning of the semiconductor device 100. In an embodiment, the ILD 120 can electrically isolate adjacent conducting layers or active components in the semiconductor device 100. By providing insulation between different layers, the ILD 120 can prevent electrical shorts, reduce (e.g., minimize) leakage current, and ensure that signals are directed only along the desired pathways. In some embodiments, the ILD 120 can help reduce parasitic capacitance between adjacent metal interconnects or active devices and provide mechanical support to the semiconductor device's structure.

The BDI 122*a* can electrically isolate individual components in the semiconductor device 100, and provide electrical isolation between each of the FETs in the stacked FET. By using a dielectric layer, which is an insulating layer that does not conduct electricity, the BDI 122*a* effectively prevents electrical crosstalk between different components and allows each component to operate independently. Further, by electrically isolating each transistor from the other, the BDI 122*a* can reduce the potential for crosstalk, which is the unwanted transfer of signals between circuit elements, thereby improving the overall performance of the semiconductor device 100.

By isolating each transistor, BDI 122*a* helps to prevent the failure of one transistor from affecting the others. This can improve the overall reliability of the device. Additionally, the BDI 122*a* allows for more flexibility in device design, as it allows each transistor in the stack to be accessed and controlled independently. This can be beneficial in a variety of applications where specific transistors may need to be activated or deactivated based on certain conditions. In some embodiments, the BDI 122*a* can help decrease the parasitic capacitance associated with the transistor, which can lead to faster switching times and improved performance.

The MDI 122*b*, similar to the BDI 122*a*, can electrically isolate individual components in the semiconductor device 100, and provide electrical isolation between each of the FETs in the stacked FET. That is, the MDI 122*b* can ensure that the operation of one component does not interfere with the operation of the others. By using a dielectric layer, which is an insulating layer that does not conduct electricity, the MDI 122*b* effectively prevents electrical crosstalk between the components and allows each one to operate independently.

By isolating each transistor, MDI 122*b* helps to prevent the failure of one transistor from affecting the others. This can improve the overall reliability of the device. Additionally, the MDI 122*b* allows for more flexibility in device design, as it allows each transistor in the stack to be accessed and controlled independently.

In some embodiments, a placeholder 124 can be epitaxially grown. The use of the placeholder 124 can provide more flexibility in the fabrication process, allowing for the creation of self-aligned backside contact area (BSCA) 116.

The via 126 can help to establish a vertical electrical connection between the first source/drain region 110*a* and the BEOL 128 through the lateral contact 114. The via 126 can facilitate efficient power delivery and signal transmission between the first source/drain region 110*a* and the BEOL 128. Fabrication of the via 126 can involve a series of processes, including at least one of lithography, etching, and deposition. The via 126 can be formed using conductive materials such as copper (Cu) or tungsten (W). The presence of the via 126 enables optimal electrical connectivity, contributing to improved device performance and reduced power losses.

In various embodiments, the via 126 is connected to the BEOL 128 via the M1 track 138. In an embodiment, the M1 track 138 can be used to connect an element of the semiconductor device 100 to the BEOL 128.

In several embodiments, the semiconductor device 100 can include a dielectric isolation layer 136*b*. The dielectric isolation layer 136*b* can cover the gate contact 136*a*. In such embodiments, a portion of the dielectric isolation layer 126*b* can be connected to the lateral contact 114. In other words, the dielectric isolation layer 136*b* can isolate the gate contact 136*a* from direct contact with the lateral contact 114. Further, the dielectric isolation layer 136*b* can isolate the gate contact 136*a* from direct contact with the first contact 112*a*. Thus, the dielectric isolation layer 136*b* can ensure that the lateral contact 114 and the gate contact 136*a* do not interfere with each other's operation. The dielectric isolation layer 136*b* can be a non-conductive, i.e., insulating, layer that can be made from materials such as silicon dioxide (SiO2) or silicon nitride (Si3N4).

In some embodiments, the dielectric isolation layer 136*b* can provide electrical isolation between different components on the semiconductor device 100, prevent unwanted current flow between different parts of the semiconductor device 100 and help reduce crosstalk or interference. Thus, the dielectric isolation layer 136*b* can ensure the proper functioning of each individual component by maintaining the integrity and stability of their individual operations. Further, the dielectric isolation layer 136*b* can reduce parasitic capacitance, which can improve the speed and performance of the semiconductor device 100.

The gate contact 136*a*, located over the gate region 118, establishes a connection between the gate region 118 and the BEOL 128. In several embodiments, the gate contact 136*a* can pass through the lateral contact 114 and the un-recessed portions 420 of the first contact 112*a*. The fabrication of the gate contact 136*a* can involve lithography and/or etching processes to define the contact area. Similar to the first and second contacts 112*a* and 112*b*, the gate contact 136*a* can be made using conductive materials such as copper (Cu) or tungsten (W).

The semiconductor device's functionality can rely on the combination of the via 126, the first contact 112*a*, the second contact 112*b*, and the lateral contact 114. These elements collectively enable efficient electrical connectivity between the first and second source/drain regions 110*a* and 110*b* and the BEOL 128. The semiconductor device 100 can benefit from improved power distribution, reduced signal losses, and enhanced signal transmission efficiency.

Example Processes for Semiconductor Device with Lateral Contact Structures

With the foregoing description of an example semiconductor device 200, it may be helpful to discuss an example process of manufacturing the same. To that end, FIGS. 2-13 illustrate various steps in the manufacture of a semiconductor device 200, consistent with illustrative embodiments. As noted above, figures denoted by A, B, and C illustrate an act of fabrication of the semiconductor device 200 from a different point of view. It is also worth mentioning that the semiconductor device 100 depicted in FIGS. 1A-1C can be the same as the example semiconductor 200 depicted in FIGS. 2-13. For ease of illustration, the fabrication operations depicted therein will be described in the context of forming stacked transistors. The stacked transistors are fabricated to include a bottom transistor and a top transistor. The bottom transistor is fabricated to include a bottom source/drain region, and the top transistor is fabricated to include a top source/drain region.

Figures 2A, 2B, 2C:
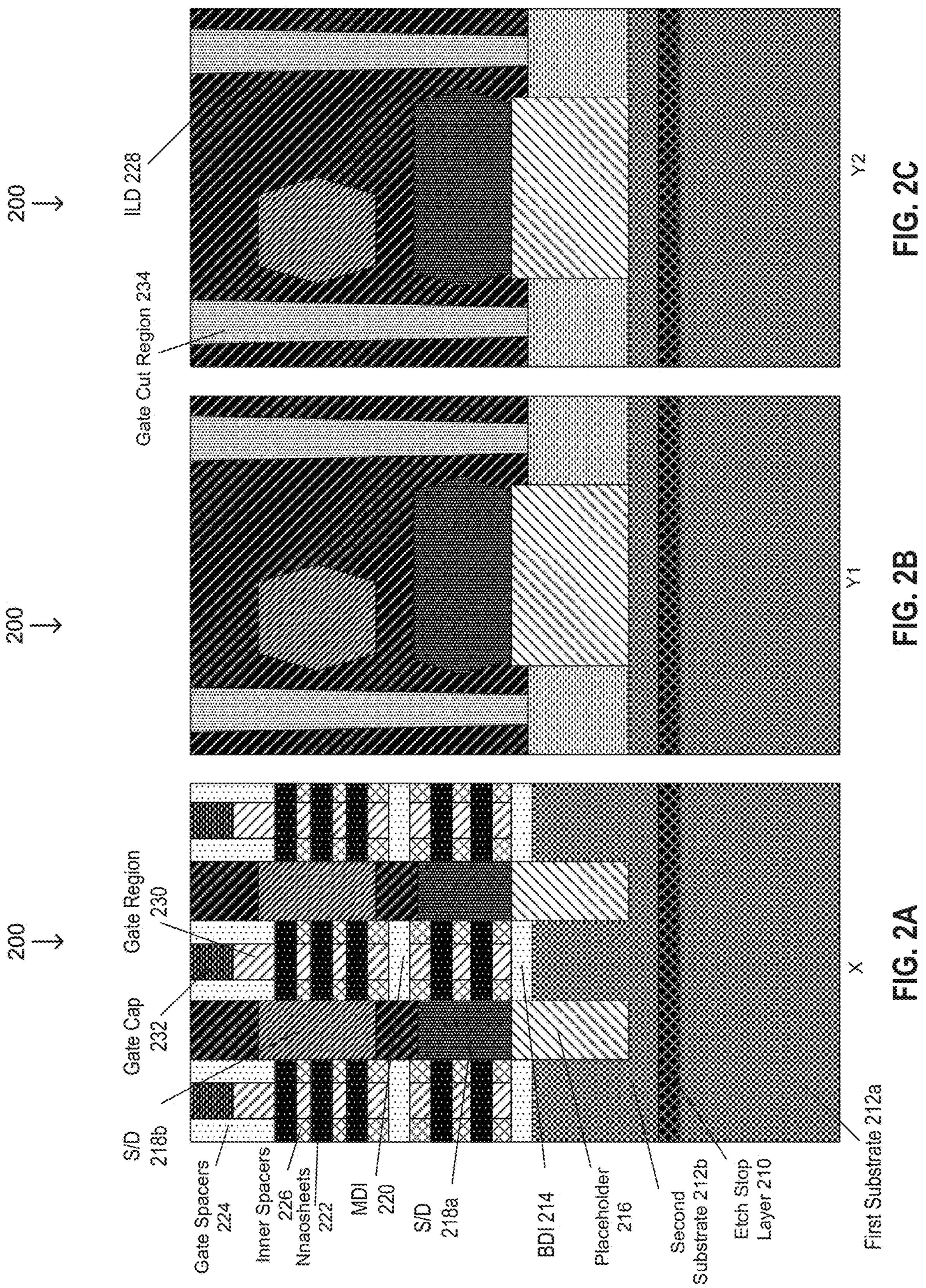
FIGS. 2A-2C illustrate side-views of a semiconductor device after the processing of the front end of line (FEOL), in accordance with some embodiments.

Referring now is made to FIGS. 2A-2C, which illustrates an example semiconductor device 200 after the processing of the front end of line (FEOL). Once the FEOL processing is performed, the example semiconductor 200 can include an etch stop layer 210 between a first substrate 212*a* and a second substrate 212*b*, a bottom dielectric isolation, BDI, 214, placeholders 216, a bottom source/drain region 218*a*, a top source/drain region 218*b*, a middle dielectric isolation, MDI, 220, nanosheets gates 222, gate spacers 224, inner spacers 226, an interlayer dielectric (ILD) 228, gate regions 230, gate caps 232, and gate cut regions 234.

In the illustrative example depicted in FIGS. 2A-2C, the semiconductor device 200 is depicted as being on silicon as the first substrate 212*a* and the second substrate 212*b*, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the first substrate 212*a* and the second substrate 212*b* may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In various embodiments, an etch stop layer 210 is formed over the first substrate 212*a*. The etch stop layer 210 can be a thin layer of material incorporated into the structure of the semiconductor device 200 to provide a selective barrier against etching processes, preventing further removal of underlying materials during fabrication. The etch stop layer 210 can enable precise control over the etching depth and help define the desired device dimensions. The etch stop layer 210 can further provide a stopping point for the etching process, ensuring that specific layers or regions are not etched beyond a certain point, leading to accurate patterning and control of critical features. The etch stop layer 210 can create a distinct separation between different layers or components within the device structure, and prevent the undesired etching of underlying layers or materials, enabling the creation of complex, multi-layered structures with well-defined interfaces and boundaries. In some embodiments, the etch stop layer 210 acts as a protective barrier for sensitive or delicate materials to shield such materials from aggressive etchants, preventing damage or degradation during subsequent fabrication steps.

In some embodiments, prior to forming the etch stop layer 210, the first substrate **212*a* is prepared by cleaning and removing any impurities or oxide layers. The etch stop layer 210 is deposited onto the first substrate 212*a* using techniques such as chemical vapor deposition (CVD), physical vapor deposition (PVD), or atomic layer deposition (ALD). In an embodiment, a photoresist can be applied, exposed to a patterned mask, developed, and used as a protective layer to define the etch stop regions. The etch stop layer 210 can then be selectively etched, stopping at a predetermined depth, while protecting the underlying layers. After the etching process, the remaining photoresist can be removed through stripping techniques. While in some embodiments, SiGe is used to form the etch stop layer 210, in some embodiments, silicon nitride (SiN) or silicon oxynitride (SiON) can be used as the etch stop layer 210. In some embodiments, a second substrate layer 2102 is epitaxially grown over the etch stop layer 210**.

In some embodiments, the nanosheets (e.g., nanosheet gates) 222 can be formed by alternating layers of Si and SiGe (not shown), in which sidewalls of the SiGe layers are indented and covered by the inner spacer 226. The SiGe layers can subsequently be removed and replaced with gate region materials.

The gate spacers 224 can be thin insulating layers or materials placed on the sidewalls of the gate regions 230 and the gate caps 232. The gate spacers 224 can help control the effective channel length of the semiconductor device 200. In various embodiments, the gate regions 230, and the gate caps 232, along with the gate spacers 224, can define the region where current flows between the bottom and top source/drain regions **218*a* and 218*b***.

In some embodiments, the gate spacers 224 can act as insulating layers between the gate regions 230 and the bottom and top source/drain regions **218*a* and 218*b*. That is, the gate spacers 224 can help prevent current leakage or short circuits between the gate regions 230 and the bottom and top source/drain regions 218*a* and 218*b*. Such isolation can help maintain the integrity of the semiconductor device's electrical operation and prevent unintended current flow that could negatively impact the performance of the semiconductor device 200** and reliability.

In further embodiments, the gate spacers 224 can be utilized to modulate the overlapping capacitance between the gate regions 230 and the bottom and top source/drain regions **218*a* and 218*b*. Overlapping capacitance can affect the semiconductor device's electrical characteristics, such as threshold voltage and switching behavior. Thus, by adjusting the thickness and material properties of the gate spacers 224**, the overlapping capacitance can be optimized, which can allow for better control and modulation of the semiconductor device's behavior.

In several embodiments, the gate spacers 224 can help mitigate the short-channel effects by physically separating the gate regions 230 from the bottom and top source/drain regions **218*a* and 218*b*. To that end, the gate spacers 224 can create a barrier that restricts the extension of the electric field into the channel region, reducing the impact of drain-induced barrier lowering and subthreshold leakage. This mitigation can improve the semiconductor device's performance, reduce power consumption, and enhance overall device reliability. In some embodiments, the bottom and top source/drain regions 218*a* and 218*b* are isolated from the gate caps 232 by the gate spacers 224**.

In an embodiment, the gate spacers 224 can serve as barriers that prevent the lateral diffusion of dopant atoms from the bottom and top source/drain regions **218*a* and 218*b*, into the channel region during the doping process. Such diffusion can alter the channel characteristics and compromise the semiconductor device's performance. By confining the dopant diffusion, the gate spacers 224** can contribute to maintaining the desired semiconductor device's characteristics and electrical behavior.

In some embodiments, the gate spacers 224 can be formed over the sidewalls of the gate regions 230. The gate spacers 224 can be formed by deposition techniques. Alternatively, the gate spacers 224 can be formed by etching or selectively epitaxially growing the gate spacers 224 over the sidewalls of the gate regions 230. In some embodiments, the gate spacers 224 can include SiGe.

In an embodiment, the inner gate spacers 226, similar to the gate spacers 224, can act as insulating layers between the gate regions 230 and the bottom and top source/drain regions **218*a* and 218*b*. In some embodiments, the inner gate spacers 226 can be the same as the gate spacers 224, which are formed over portions of the gate regions 230 confined between the nanosheet gates 222**.

The ILD 228 can be deposited onto the substrate using various techniques such as CVD, spin-on deposition, plasma-enhanced CVD (PECVD), or ALD. In some embodiments, after deposition, planarization techniques are employed to ensure a flat and smooth surface. Chemical mechanical polishing (CMP) can be used to remove excess material and achieve a uniform surface topography. In some embodiments, porous silicates, carbon doped oxides, silicon dioxides, silicon nitrides, silicon oxynitrides, or other dielectric materials., or low-k dielectrics, e.g., organosilicates, fluorinated silicates, or porous materials, can be used as ILD 228. Alternatively, polymer-based materials, such as polyimide or polybenzoxazole (PBO), can be used as ILD 228.

The gate caps 232 can be formed over a plurality of gate regions. In some embodiments, the gate caps 232 can be made of the same materials as the gate spacers 224 and the inner gate spacers 226. A Gate region 230 can include a thin layer of gate dielectric, and gate metals. It should be noted that, for the sake of simplicity, the gate dielectric is not drawn separately in FIGS. 2A-2C. The gate metals can be separated from the gate channel by the gate dielectric. The gate dielectric can include SiO2, HfO2, or HfLaOX.

The gate cut regions 234 form areas where the gate regions 230 are removed to create a non-continuous gate across the semiconductor device 200, segmenting it into individual FET units in the stack. The gate cut regions 234 can physically disconnect these continuous gate regions 230, enabling independent control over each of the FETs within the stack. The gate cut regions 234 can help in reducing crosstalk between individual FETs in the stack, enhancing the overall semiconductor device 200 performance. Further, by isolating each FET in the stack, the gate cut regions 234 can prevent the failure of one transistor from affecting the others, thereby improving the overall reliability of the semiconductor device 200. In an embodiment, the gate cut regions 234 provide flexibility in the semiconductor device design, by allowing for the individual FETs within the stack to be accessed and controlled independently, which can be advantageous in custom circuit design. In some embodiments, the use of gate cut regions 234 can allow for fine-tuning of the semiconductor device's characteristics post-fabrication, as different gate voltages can be applied to different FETs in the stack.

Figures 3A, 3B, 3C:
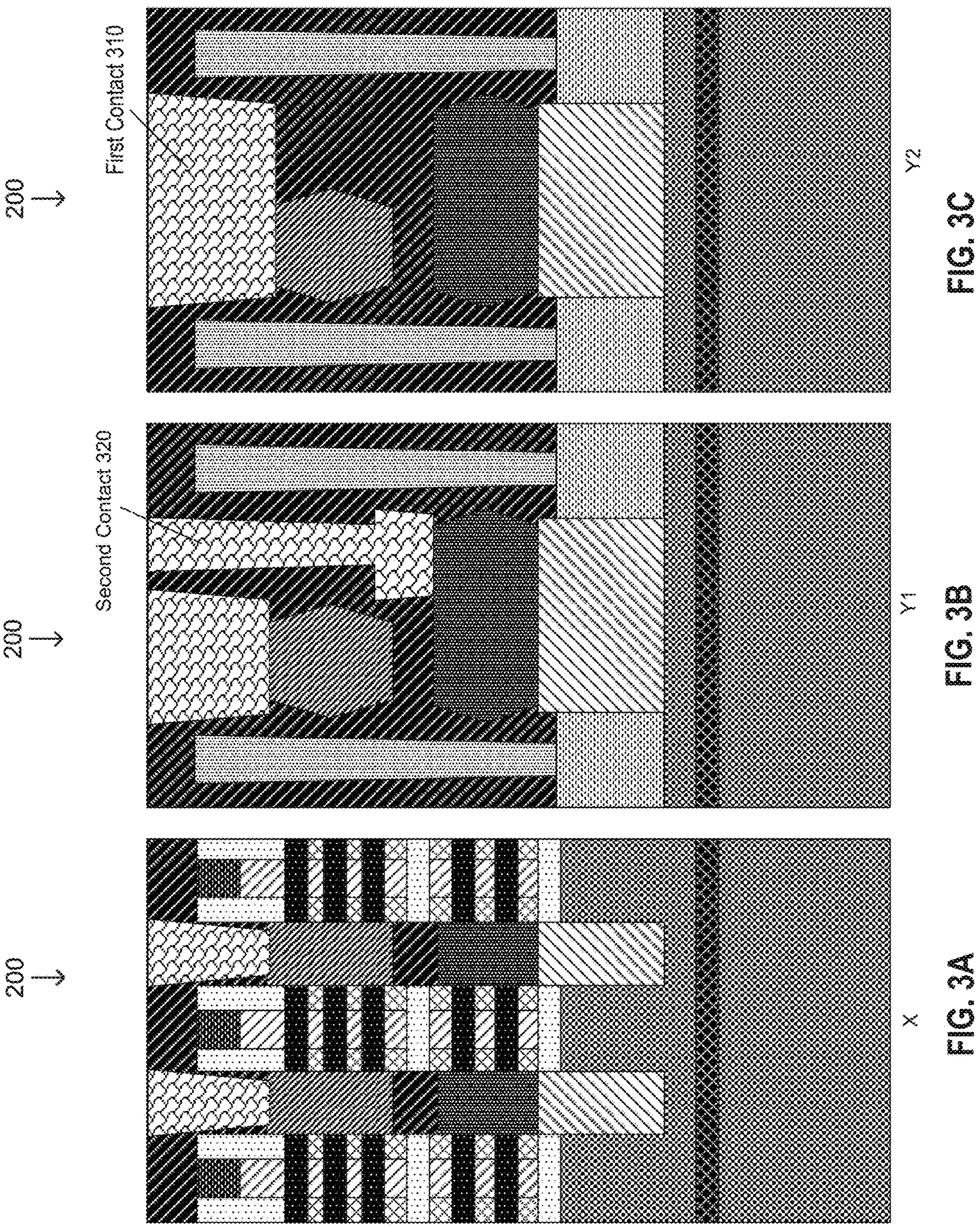
FIGS. 3A-3C illustrate side-views of a semiconductor device after the formation of the first and second contacts, in accordance with some embodiments.

FIGS. 3A-3C illustrate side-views of a semiconductor device after the formation of the source/drain region contacts over the bottom source/drain region, in accordance with some embodiments. In an embodiment, the first and second contacts 310 and 320 can be formed over the first and second source/drain regions. The first and second contacts 310 and 320 can be recessed, and chemical mechanical polishing (CMP) and metallization processes can be performed.

Figures 4A, 4B, 4C:
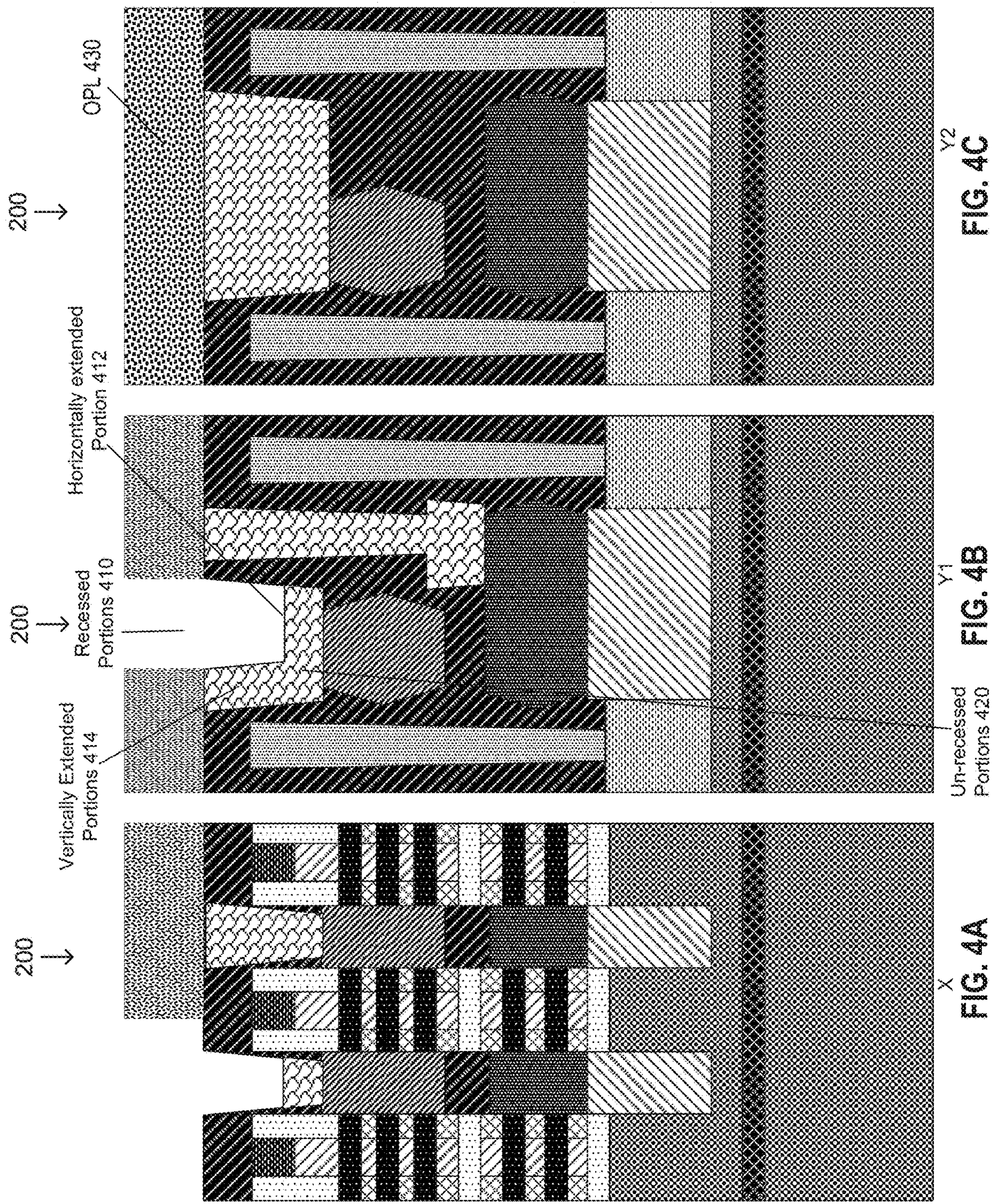
FIGS. 4A-4C illustrate side-views of a semiconductor device after the patterning of the source/drain contact, in accordance with some embodiments.

FIGS. 4A-4C illustrate side-views of a semiconductor device after the patterning of a contact area for the top source/drain region, in accordance with some embodiments.

In some embodiments, portions of the first contact are recessed, forming recessed portions 410 and un-recessed portions 420. In an embodiment, the un-recessed portions 420 of the first contact can include a horizontally extended portion 412 over the first source/drain region and a vertically extended portion 414 that connects the horizontally extended portion 412, hence the first source/drain region, to the OPL 430. In various embodiments, the recessed portions 410 can be filled with the ILD during the fabrication process of the semiconductor device 200. Further, the lateral contact can be formed within the recessed portions 410 in the next steps. Thus, the ILD can isolate the lateral contact from the un-recessed portions 420 of the first contact.

In an embodiment, a portion of the contact metal over the first source/drain region is removed to form a cavity. The recessed portions 410 and the un-recessed portions 420 can be formed as a result of the formation of the cavity. The patterning process can be performed by using a conventional lithography stack (such as an organic planarization layer, OPL, 430, with SiARC and photo-resist (not shown)). In some embodiments, the OPL 430 can be applied using spin coating technology, although other techniques are within the contemplated scope of the present disclosure. Once the OPL 430 is formed, the contact recess patterning is performed to form the recess.

Figures 5A, 5B, 5C:
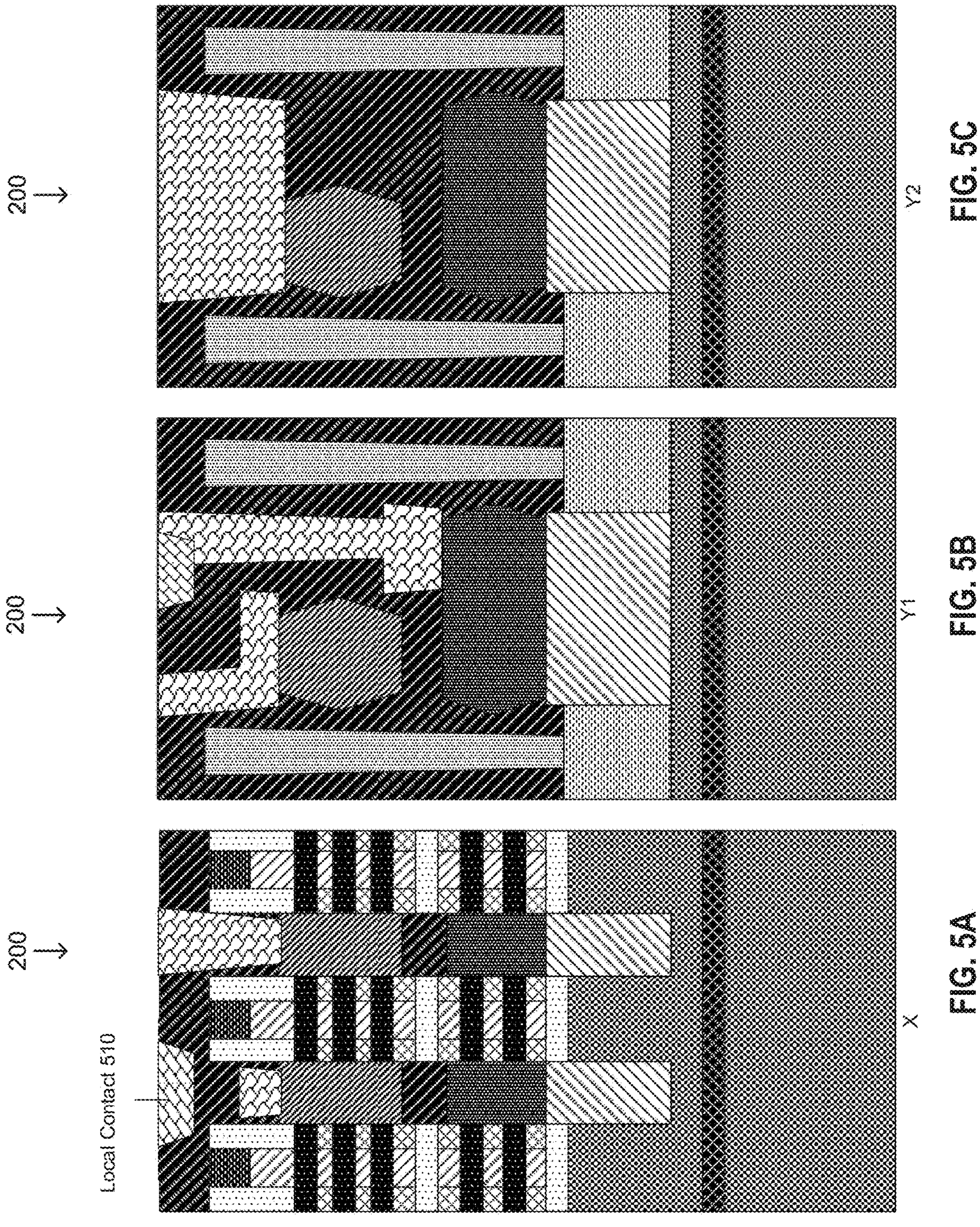
FIGS. 5A-5C illustrate side-views of a semiconductor device after the patterning and metallization of the lateral contact, in accordance with some embodiments.

FIGS. 5A-5C illustrate side-views of a semiconductor device after the formation of a lateral contact, in accordance with some embodiments. In an embodiment, portions of the additional layer of ILD are removed and the lateral contact 510 is formed within the removed portions of the additional layer of ILD. Thus, the lateral contact 510 can connect the second source/drain region to the top surface of the semiconductor device 200 via the second contact. CMP and metallization processes can further be performed. In several embodiments, the lateral contact 510 does not need to be located at the centerline of the first and second source/drain regions. That is, the location of the lateral contact 510 can be offset from the centerline of the first and second source/drain regions. As a result, the process of formation of the via is facilitated.

Figures 6A, 6B, 6C:
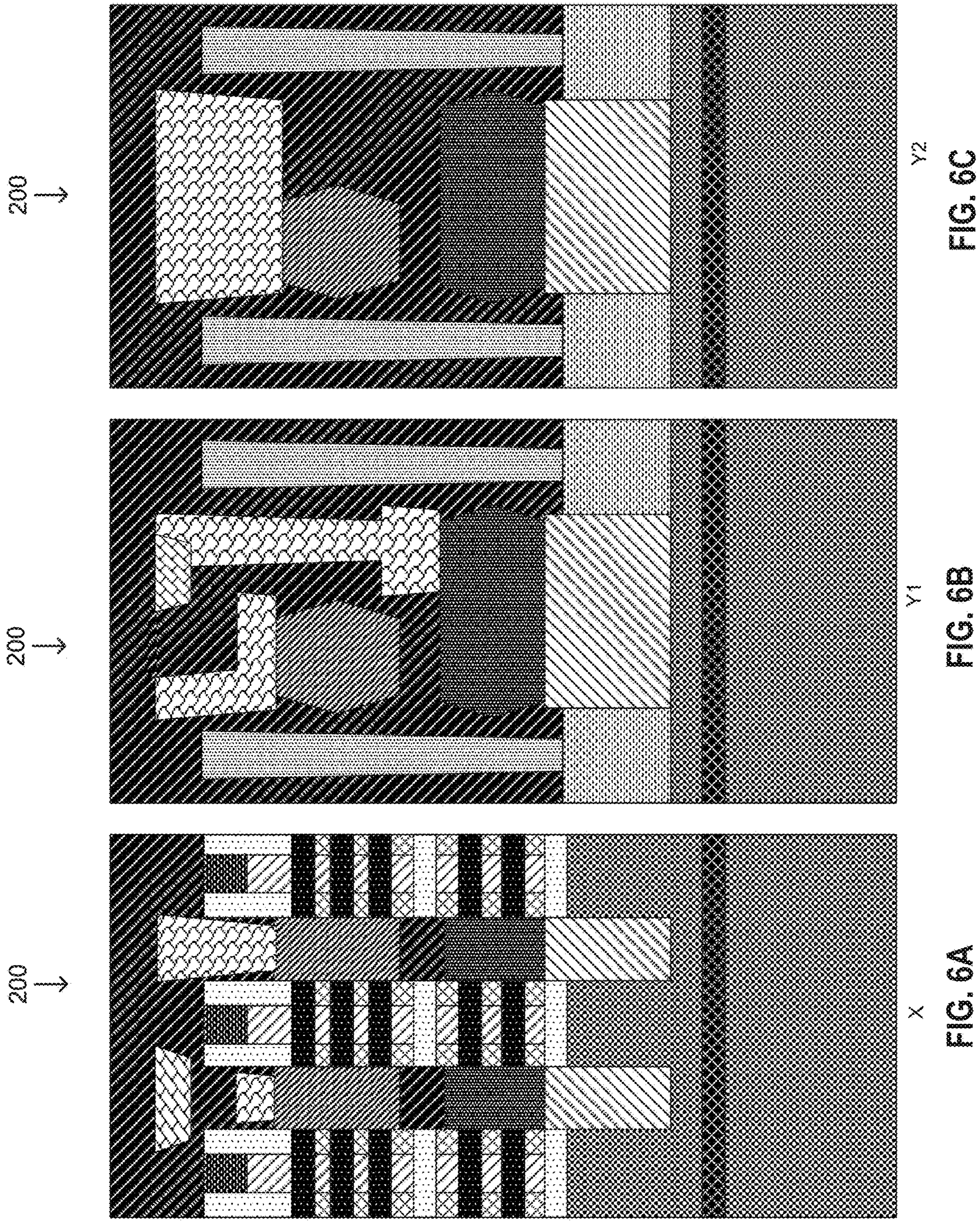
FIGS. 6A-6C illustrate side-views of a semiconductor device after the formation of the additional ILD, in accordance with some embodiments.

FIGS. 6A-6C illustrate side-views of a semiconductor device after an additional ILD, in accordance with some embodiments. In an embodiment, another additional layer of ILD is formed over the top surface of the semiconductor device 200.

Figures 7A, 7B, 7C:
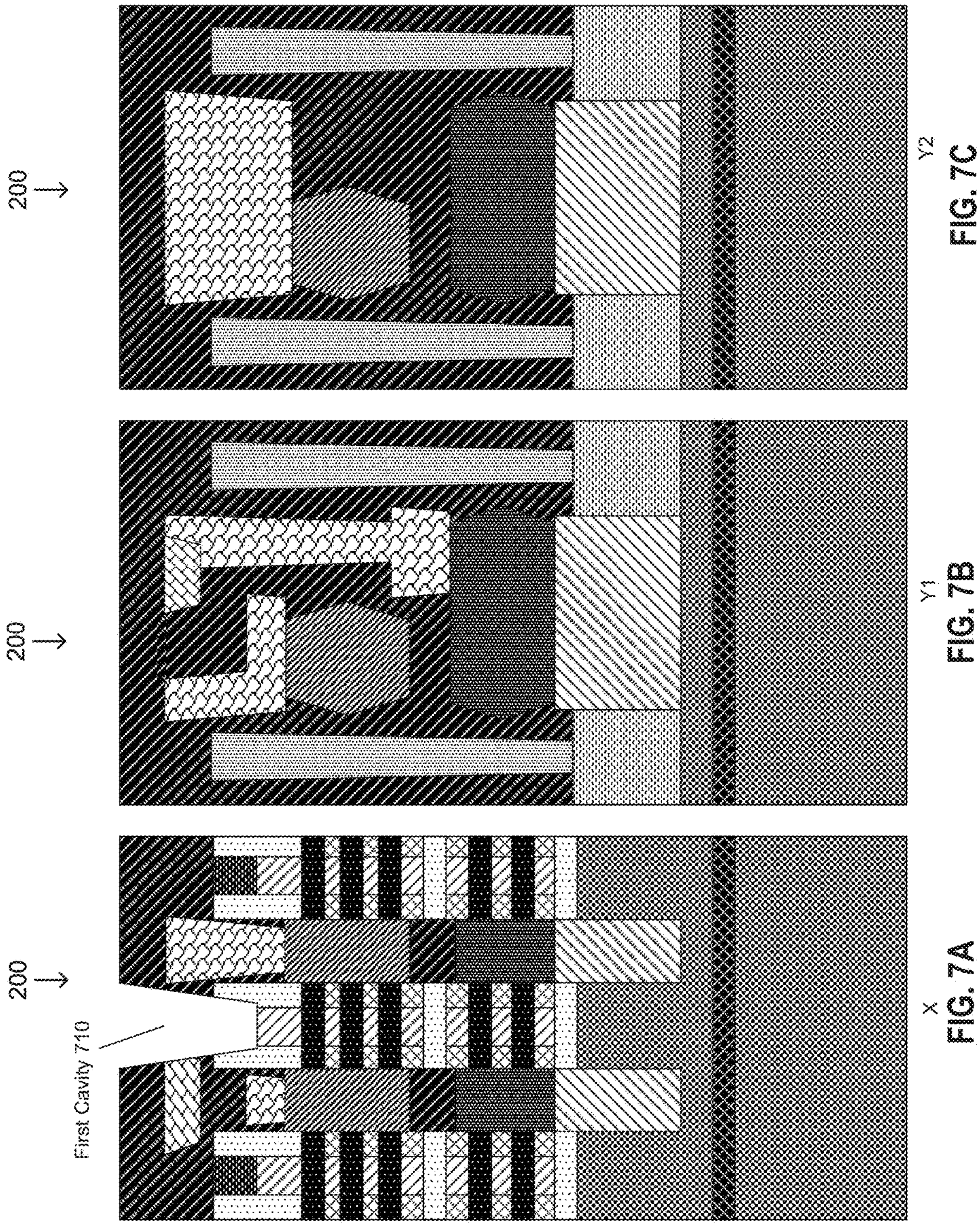
FIGS. 7A-7C illustrate side-views of a semiconductor device after the patterning of the gate contact, in accordance with some embodiments.

FIGS. 7A-7C illustrate side-views of a semiconductor device after the pattering of a gate contact, in accordance with some embodiments. In an embodiment, portions of the ILD layer are removed from the top surface of the semiconductor device 200 to reach the top of the gate region. As a result, a first cavity 710 is formed over the gate region.

Figures 8A, 8B, 8C:
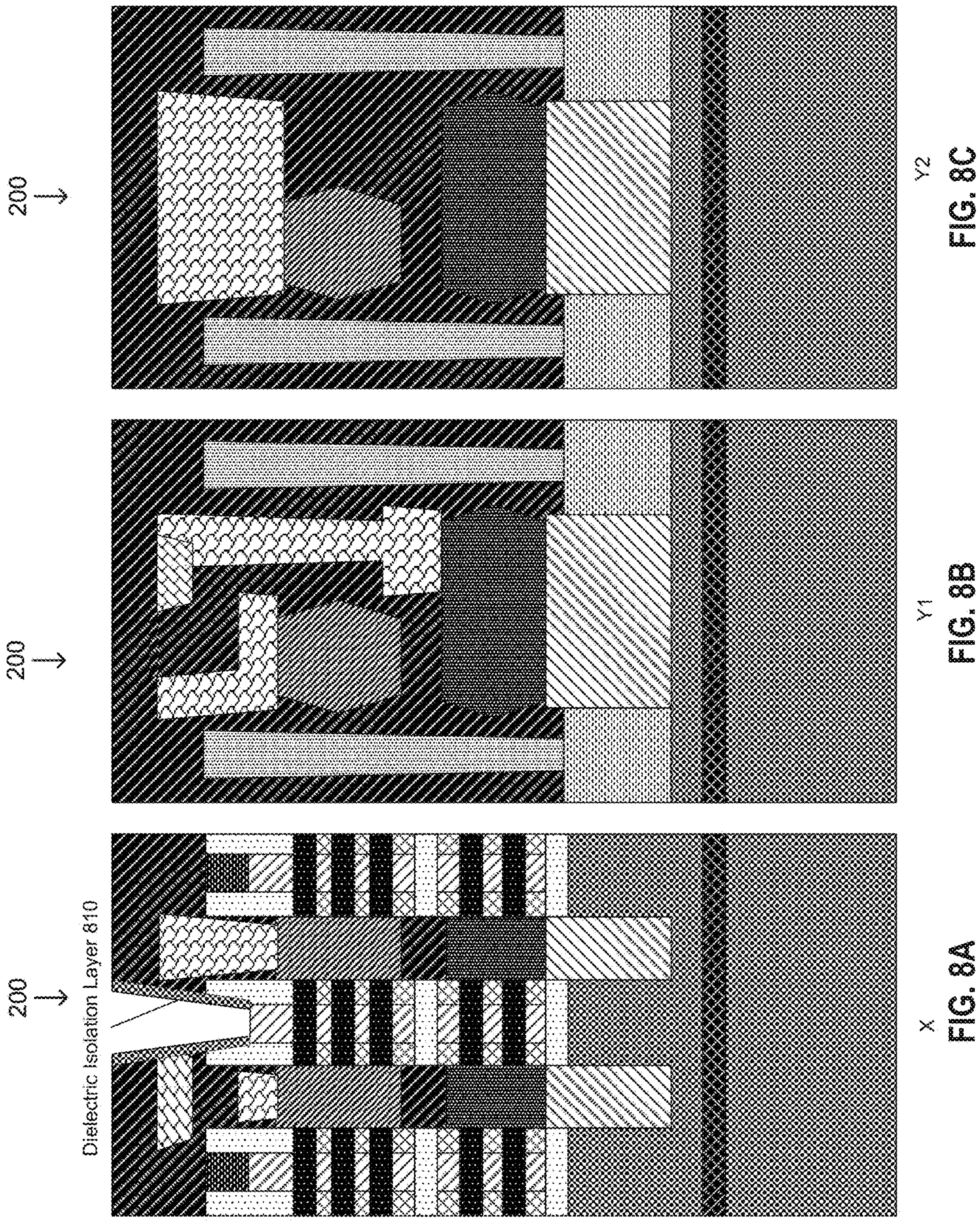
FIGS. 8A-8C illustrate side-views of a semiconductor device after the formation of the spacer, in accordance with some embodiments.

FIGS. 8A-8C illustrate side-views of a semiconductor device after the formation of the dielectric isolation layer, in accordance with some embodiments. In an embodiment, the dielectric isolation layer 810 is formed over the sidewalls of the cavity over the gate region.

In various embodiments, the dielectric isolation layer 810 is formed by techniques such as Chemical Vapor Deposition (CVD) or Atomic Layer Deposition (ALD) to deposit the first isolation dielectric layer 810. This can be followed by an anisotropic etch process to remove the liner from horizontal surfaces.

Figures 9A, 9B, 9C:
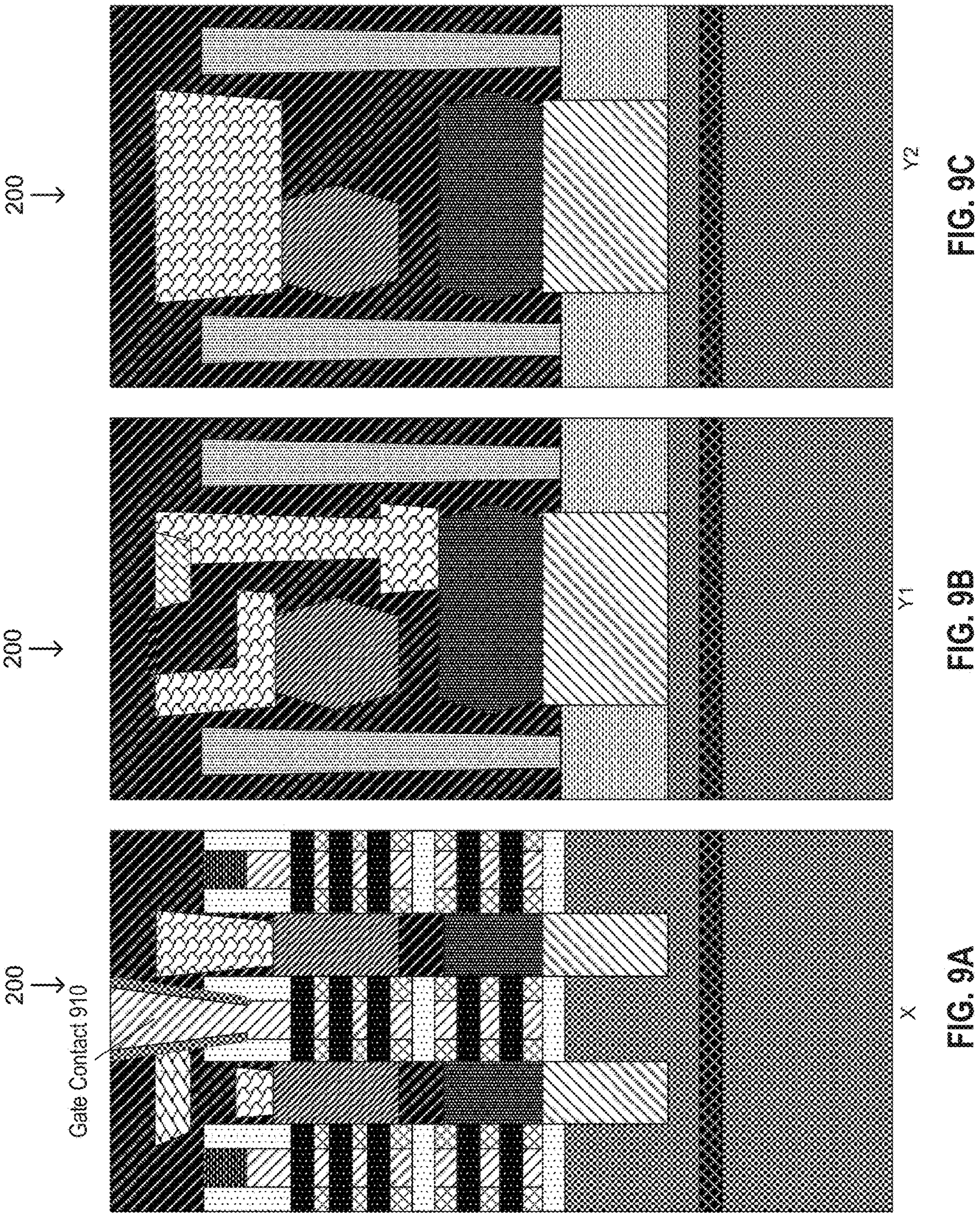
FIGS. 9A-9C illustrate side-views of a semiconductor device after the metallization of the gate contact via, in accordance with some embodiments.

FIGS. 9A-9C illustrate side-views of a semiconductor device after the metallization of the gate contact, in accordance with some embodiments. In an embodiment, the dielectric isolation layer-coated cavity can be filled with suitable materials to form the gate contact 910.

Figures 10A, 10B, 10C:
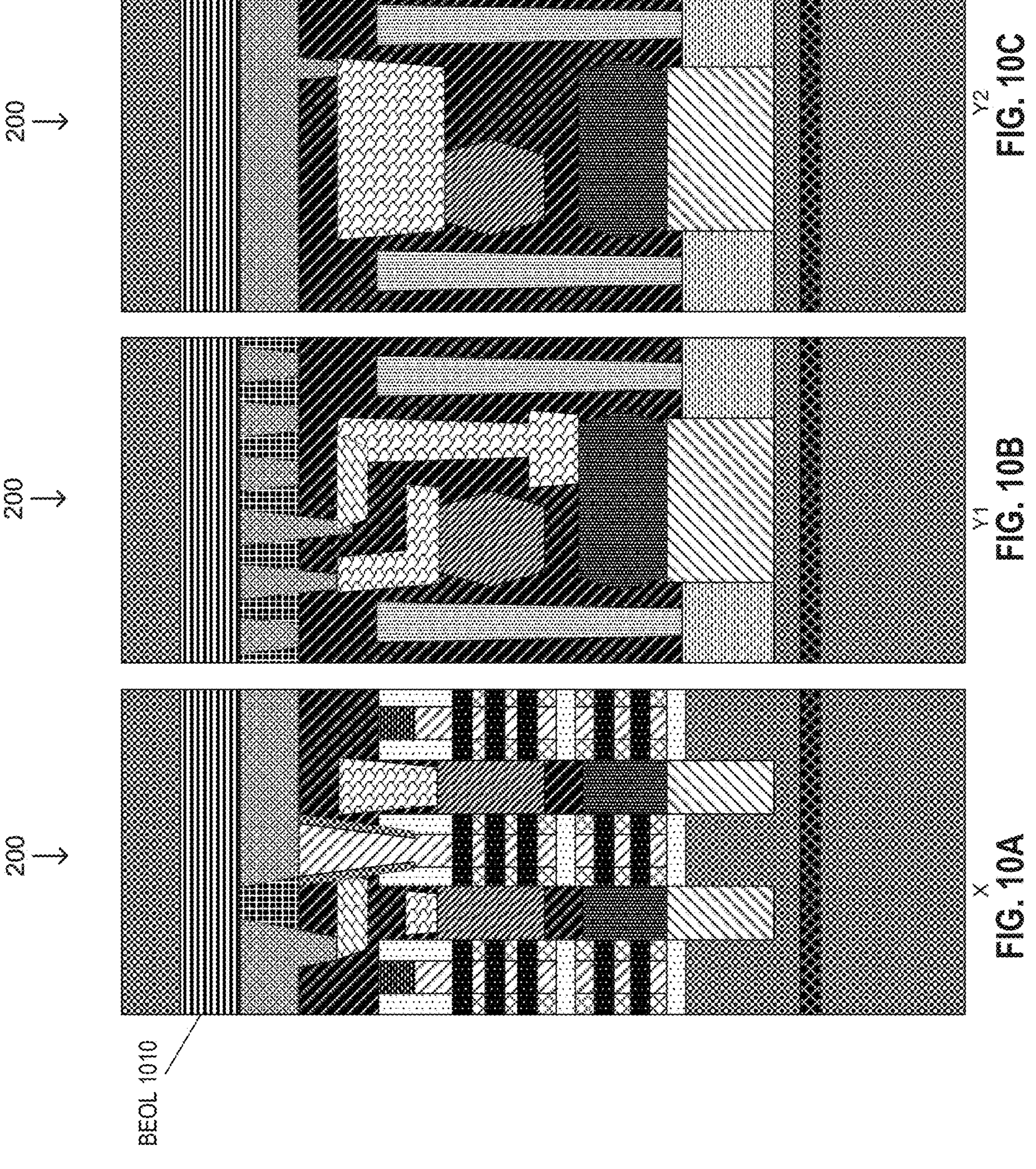
FIGS. 10A-10C illustrate side-views of a semiconductor device after the wafer bonding, in accordance with some embodiments.

FIGS. 10A-10C illustrate side-views of a semiconductor device after the wafer bonding, in accordance with some embodiments. In some embodiments, the back end of line, BEOL, 1010 and wafer bonding are performed. In various embodiments, carrier wafer bonding, also known as wafer-to-wafer bonding or chip-to-wafer bonding, is performed to join two semiconductor devices together by creating a permanent bond between them. In some embodiments, the two semiconductor devices can be brought into contact and bonded at the atomic or molecular level, to create an interface. In an embodiment, the two semiconductor devices are brought into contact under controlled conditions, such as controlled pressure and temperature, to enable atomic or molecular bonding at the interface. Such bonding can be done at room temperature or with elevated temperatures. Alternatively, in some embodiments, an electric field and elevated temperature are utilized to create a bond. One semiconductor device can be made of semiconductor material, while the other can be a glass or silicon dioxide (SiO2) wafer. The electric field can cause ions in the glass or SiO2 to migrate and chemically bond with the semiconductor material in the other semiconductor device. In additional embodiments, a thin metal layer or metal alloy can be used as an intermediate bonding layer between the semiconductor devices. The metal layer can be deposited or transferred onto one or both semiconductor device surfaces, and the semiconductor devices can then be brought into contact and subjected to temperature and pressure to create a metallic bon1

Figures 11A, 11B, 11C:
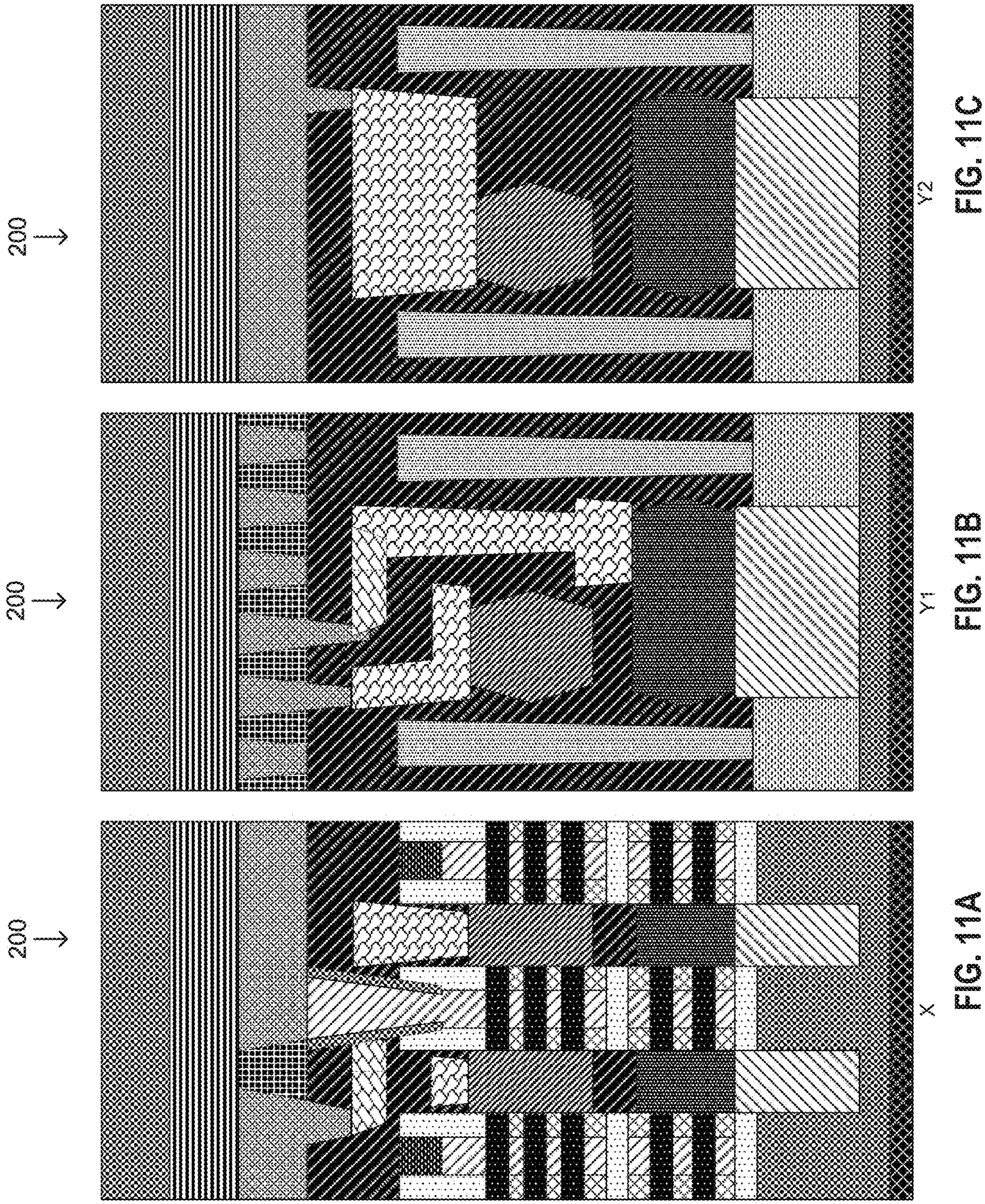
FIGS. 11A-11C illustrate side-views of a semiconductor device after the removal of the substrate, in accordance with some embodiments.

FIGS. 11A-11C illustrate side-views of a semiconductor device after the substrate is removed, in accordance with some embodiments. In some embodiments, the wafer is flipped, and the first substrate is removed. The first substrate removal process can proceed until reaching the etch stop layer. It should be noted that, for the sake of simplicity, the semiconductor device 200 is not shown are flipped.

Figures 12A, 12B, 12C:
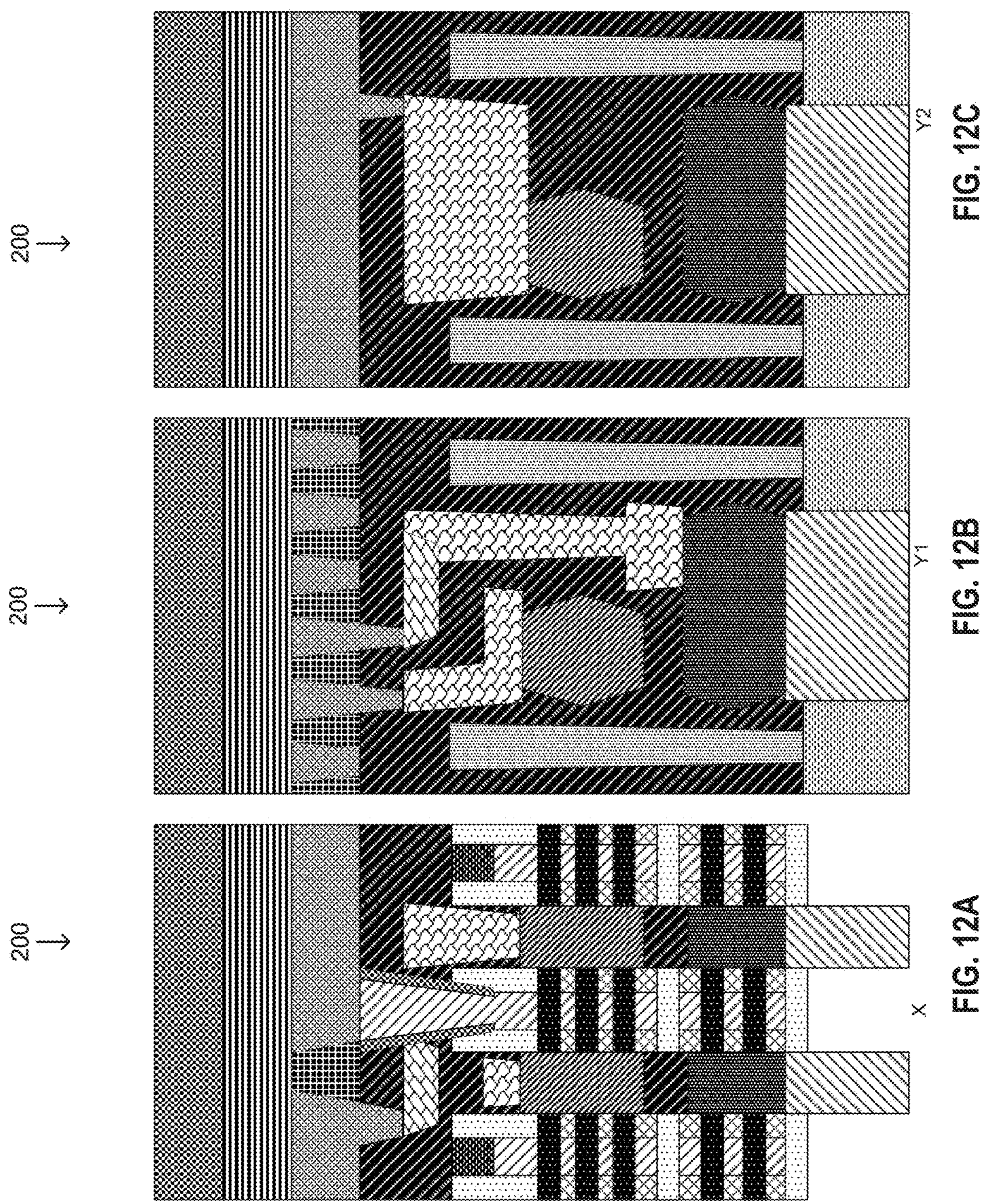
FIGS. 12A-12C illustrate side-views of a semiconductor device after the removal of the etch stop layer, in accordance with some embodiments.

FIGS. 12A-12C illustrate side-views of a semiconductor device after the etch stop layer is removed, in accordance with some embodiments. In some embodiments, the etch stop layer is removed, followed by removing the remaining substrate, i.e., the second substrate.

Figures 13A, 13B, 13C:
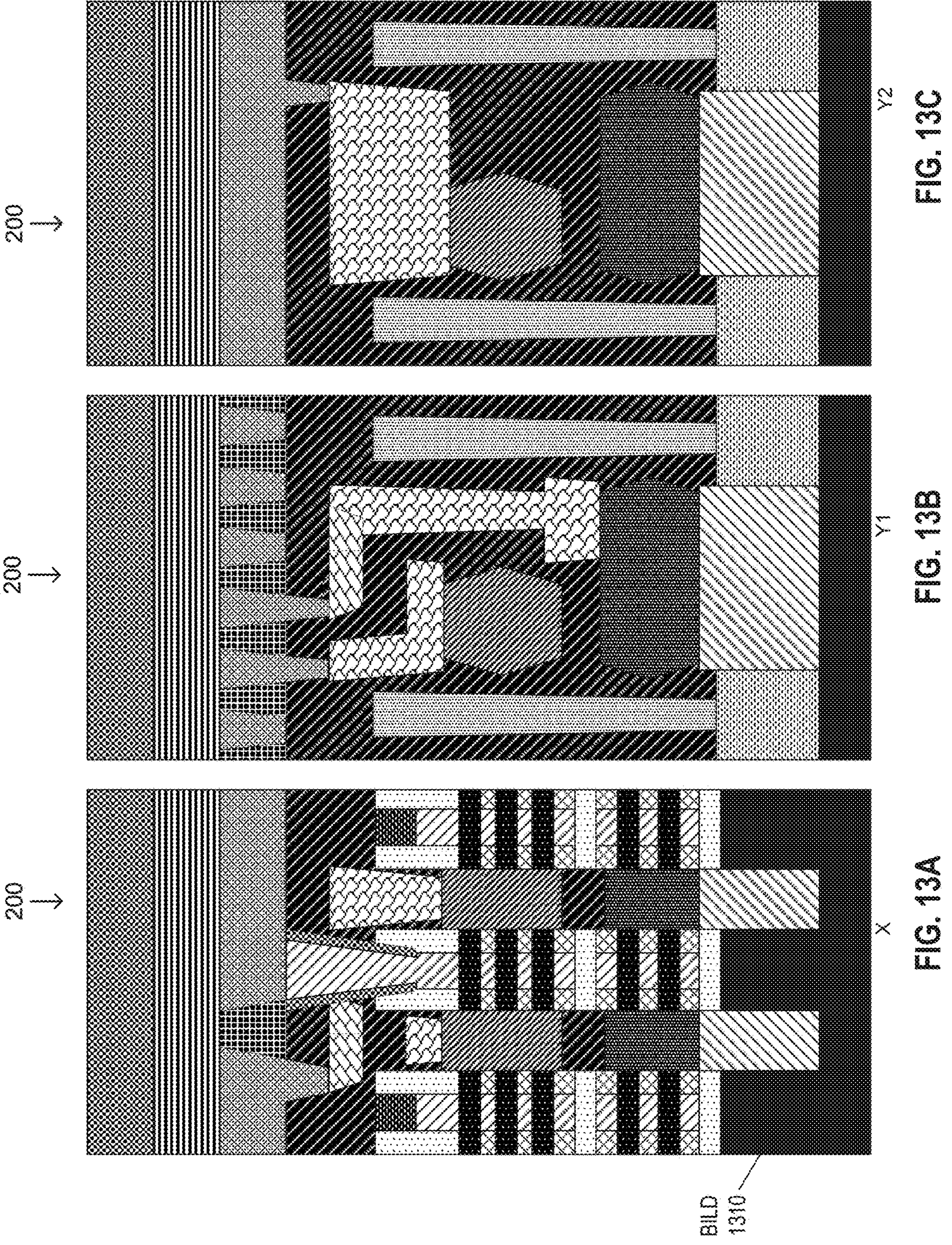
FIGS. 13A-13C illustrate side-views of a semiconductor device after the formation of the backside ILD, in accordance with some embodiments.

FIGS. 13A-13C illustrate side-views of a semiconductor device after the backside ILD is deposited, in accordance with some embodiments. In some embodiments, the backside ILD, BILD, 1310 is formed below the BDI, and surrounds the placeholder, and the STI. In an embodiment, a CMP process is further processed after the formation of the BILD 1310.

The BILD 1310 can be an insulating material or layer used to isolate and provide electrical insulation between the semiconductor device's active regions and the BSCA 1410 (shown in FIGS. 14A-14C), and to prevent unwanted electrical contact between the active regions and the backside contact, ensuring the proper functioning and integrity of the semiconductor device 200. In various embodiments, the BILD 1310 can act as a protective layer, shielding the active regions of the semiconductor device 200 from external contaminants, moisture, and mechanical stress. The BILD 1310 can further help prevent physical damage, such as scratches or particle contamination, which could adversely affect semiconductor device performance. Additionally, the BILD 1310 can act as a barrier against moisture ingress, which can cause corrosion and degradation of the semiconductor device's components. In some embodiments, the placeholder can be removed so that a recess is formed that exposes the bottom of the first source/drain region. The BSCA 1410 is formed within the recess by filling by a metal contact.

Figures 14A, 14B, 14C:
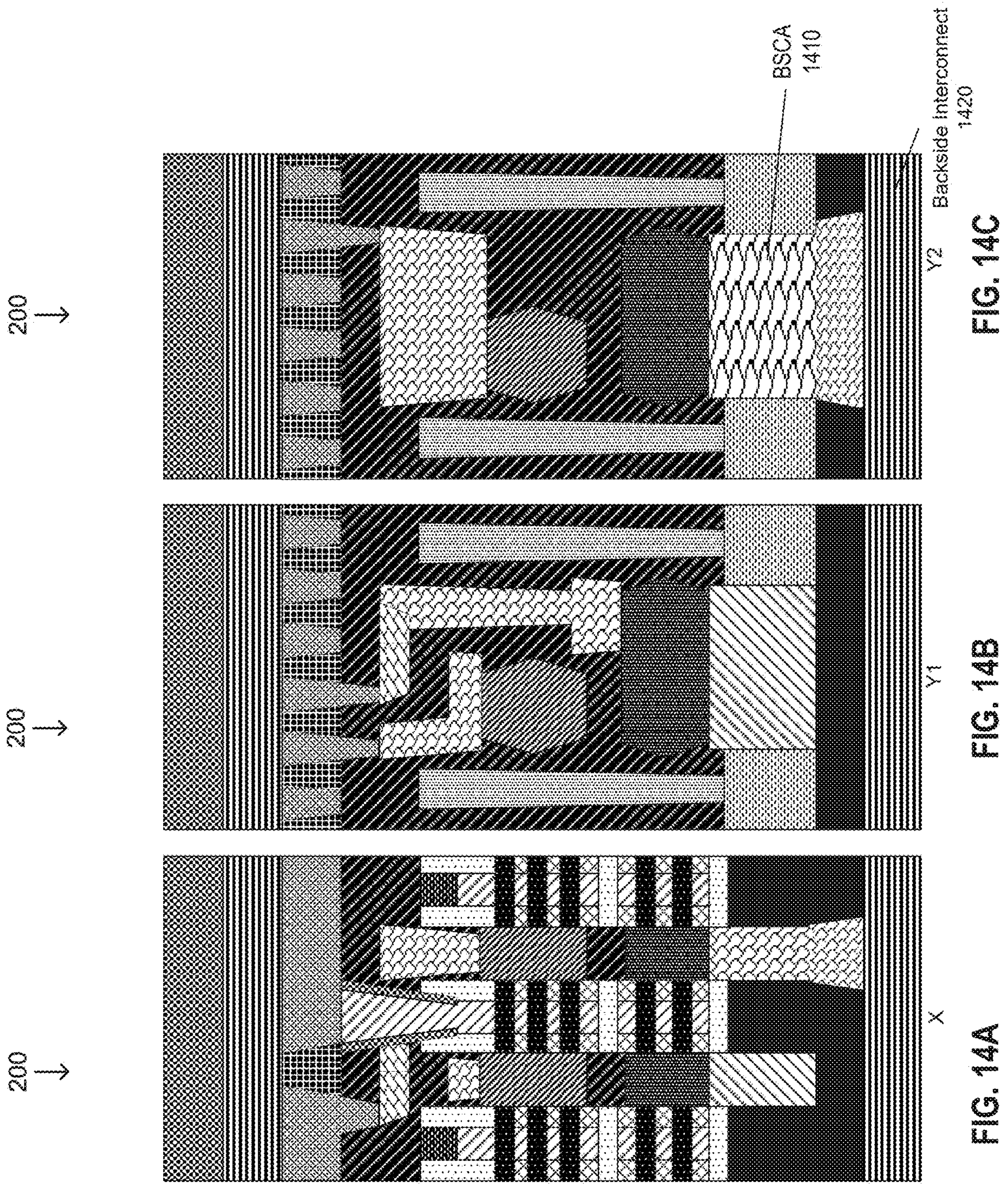
FIGS. 14A-14C illustrate side-views of a semiconductor device after the formation of the backside interconnect, in accordance with some embodiments.

FIGS. 14A-14C illustrate side-views of a semiconductor device after the backside interconnect is patterned, in accordance with some embodiments. In some embodiments, a sacrificial placeholder is removed to form a recess. Subsequently, the BSCA 1410 is formed within the recess by filling by a metal contact. The backside interconnect 1420 can then be formed over the placeholder, the BDI, the BSCA 1410, and the STI. The backside interconnect 1420 can be used to connect the semiconductor device 200 to other devices.

Figure 15A:
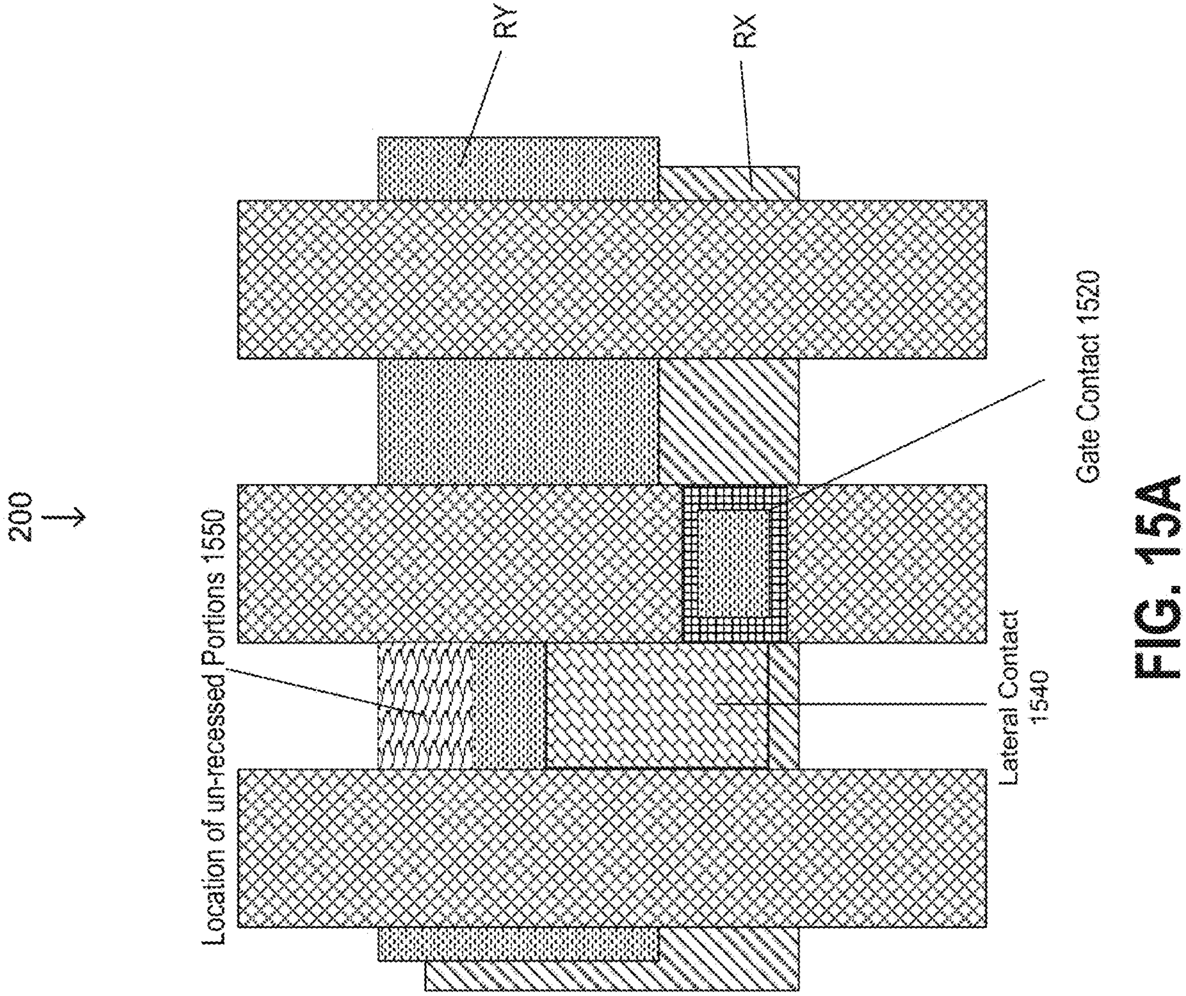
FIGS. 15A-15B illustrate top views of a semiconductor device depicting the location of the un-recessed contact, in accordance with some embodiments.
Figure 15B:
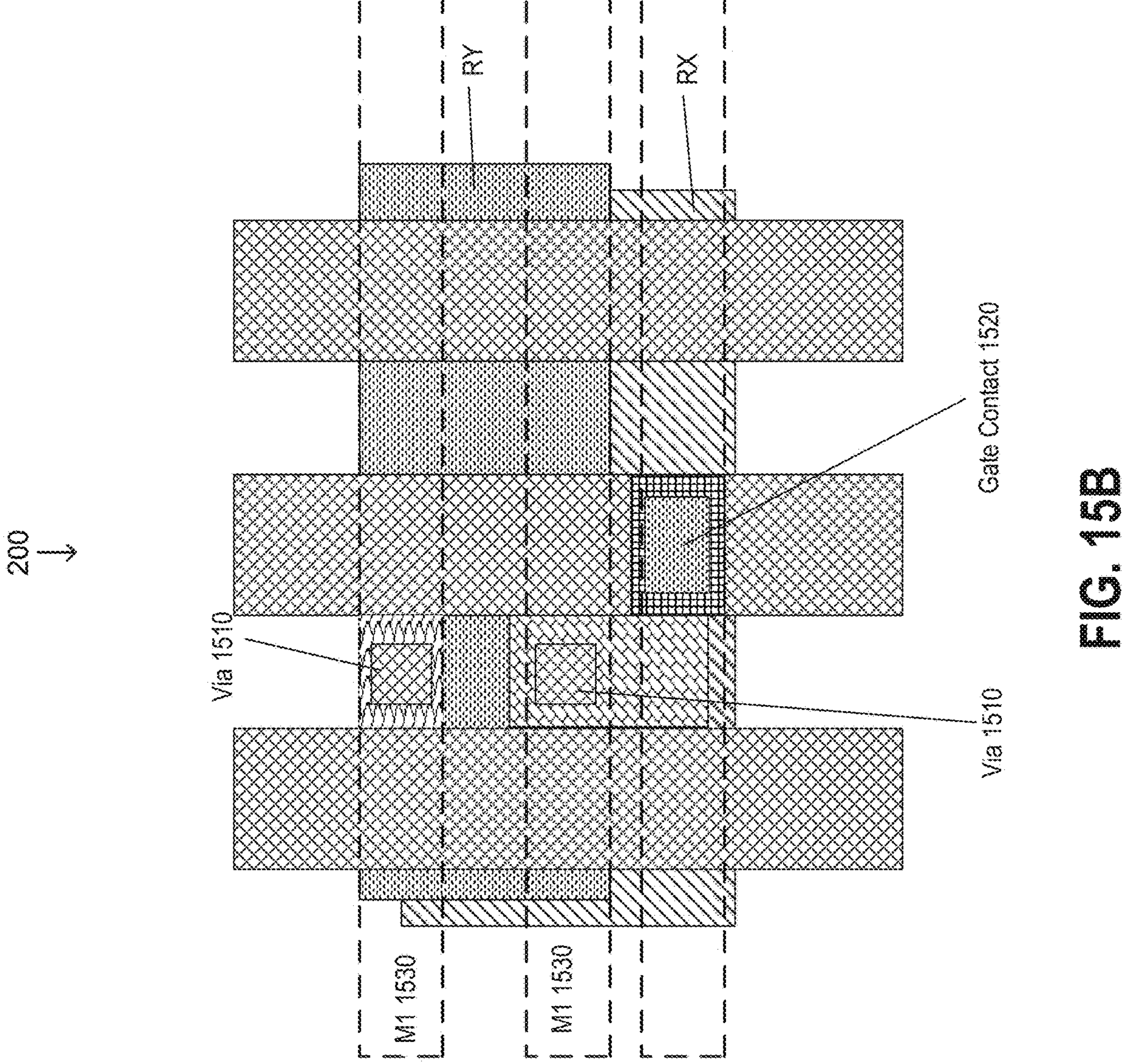

FIGS. 15A-15B illustrate top-views of a semiconductor device, in accordance with some embodiments. In an embodiment, the via 1510 and the gate contact 1520 can be located on different M1 tracks 1530. In such an embodiment, the lateral contact 1540 can be formed with a first size. The location of the un-recessed portions 1550 of the first contact is also shown.

Figure 16A:
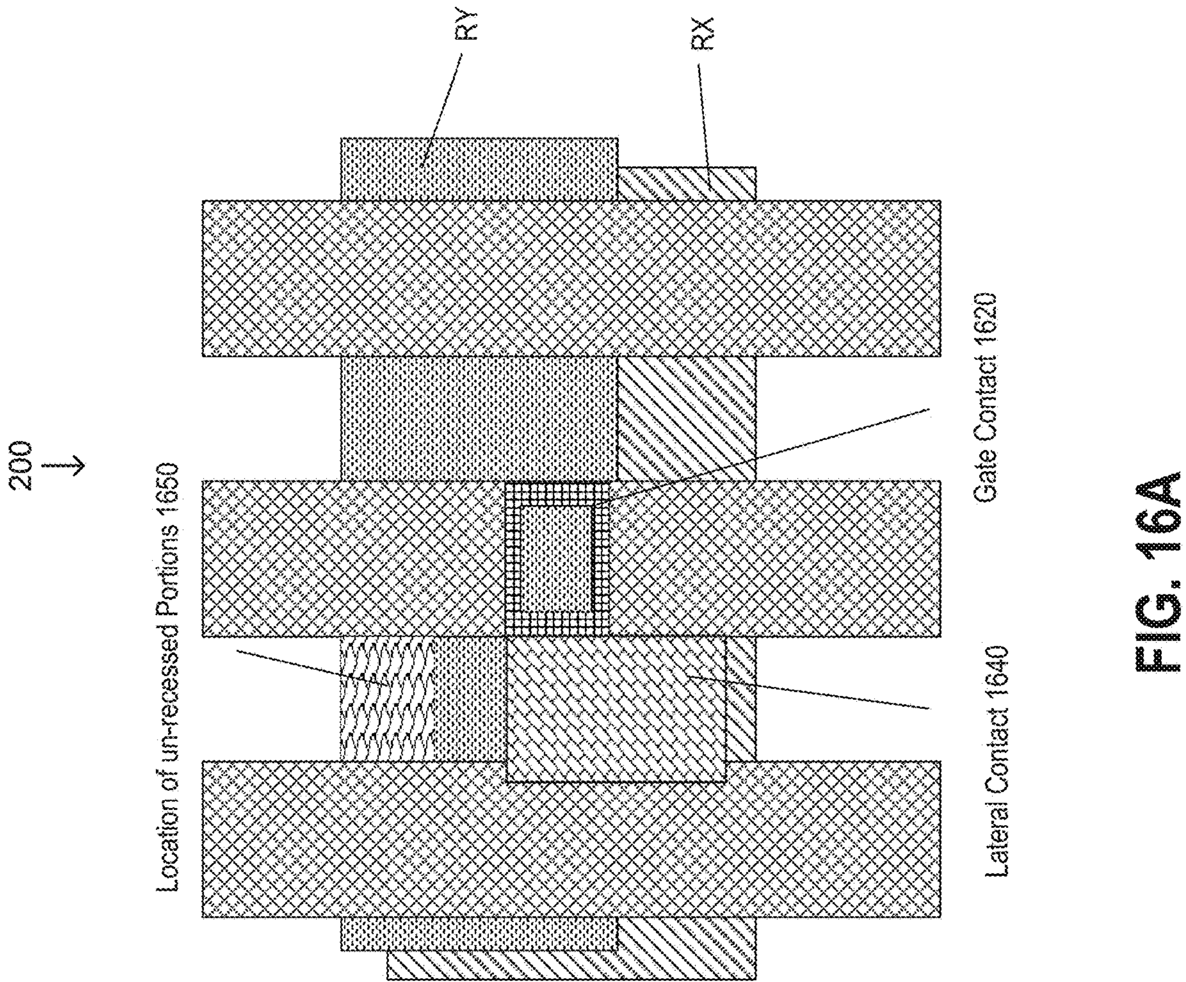
FIGS. 16A-16B illustrate top views of a semiconductor device depicting the location of the un-recessed contact, in accordance with some embodiments.
Figure 16B:
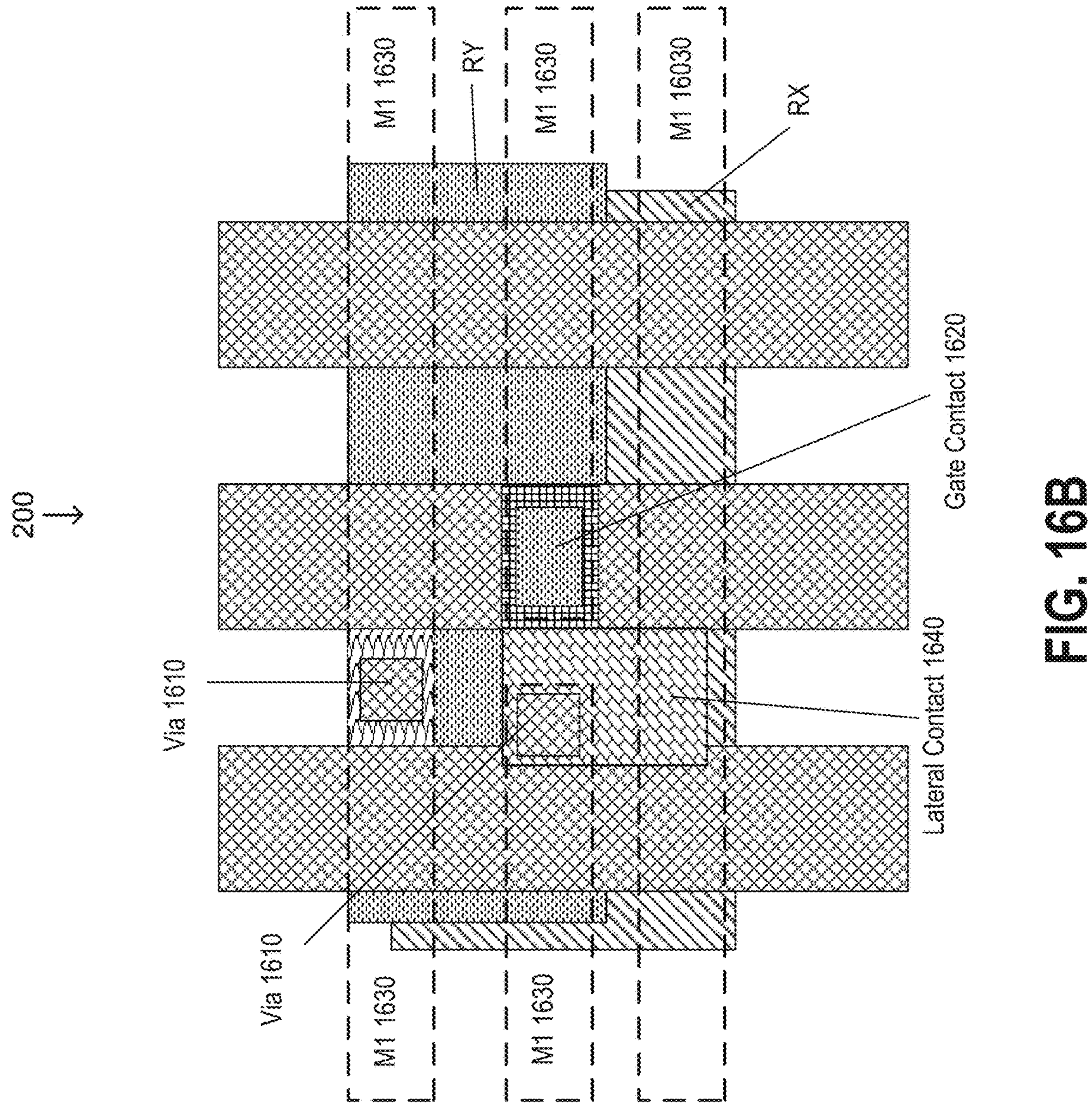

FIGS. 16A-16B illustrate top-views of a semiconductor device, in accordance with some embodiments. In an embodiment, the via 1610 and the gate contact 1620 can be located on the same track, i.e., the same portion of the metal connection layer, M1, 1630. In such an embodiment, the location of the lateral contact 1640 can be offset from the centerline of the first and second source/drain regions. The location of the un-recessed portions 1650 of the first contact is also shown.

Figure 17A:
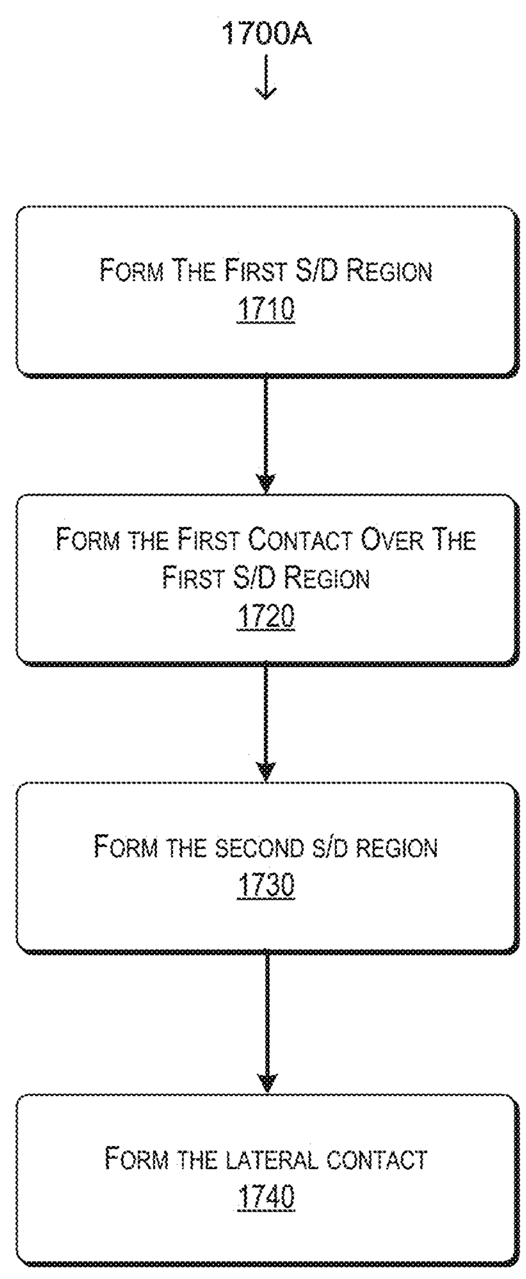
FIGS. 17A-17B illustrate block diagrams of a method for forming the semiconductor device, in accordance with some embodiments.
Figure 17B:
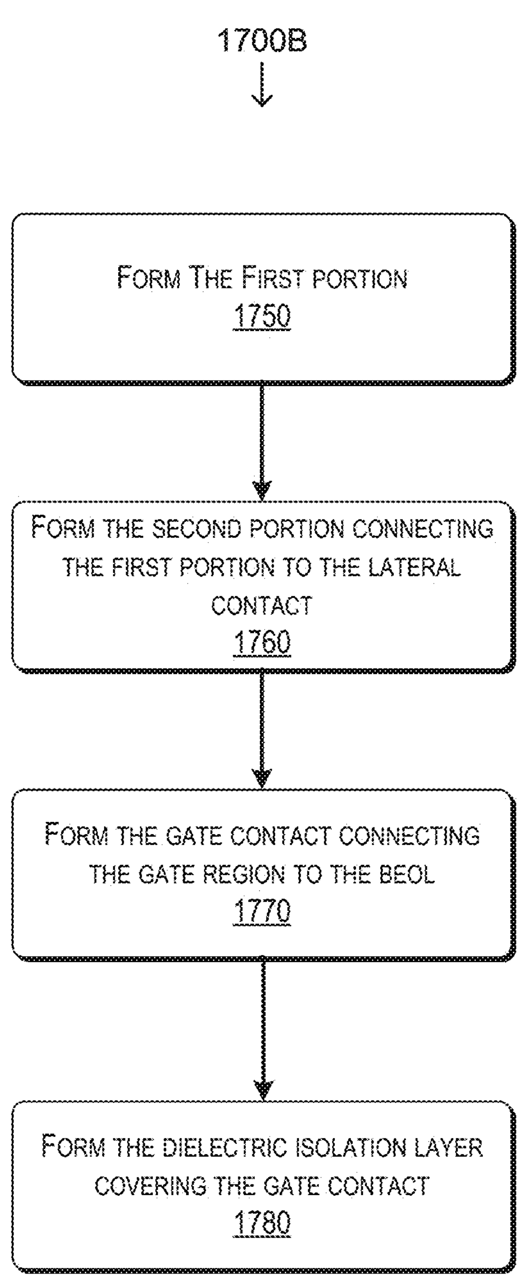

FIGS. 17A-17B illustrate block diagrams of a method 1700A for forming the semiconductor device, in accordance with some embodiments. Referring to FIG. 17A now, the method 1700A can begin when a first source/drain region is formed, as shown by block 1710.

In an embodiment, the method 1700A proceeds when a first contact is formed over the first source/drain region, as shown by block 1720. Portions of the first contact can be recessed.

In some embodiments, the method 1700A continues when a second source/drain region is formed, as shown by block 1730.

In some embodiments, the method 1700A continues when a lateral contact is formed, as shown by block 1740. The lateral contact can connect the second source/drain region to a back end of line (BEOL). In some embodiments, the lateral contact overlaps with the recessed portions of the first contact.

Referring to FIG. 17B now, a method 1700B for forming the semiconductor device, is shown. The method 1700B can begin when a first portion is formed over the second source/drain region, as shown by block 1750.

In some embodiments, the method 1700B continues when a second portion connecting the first portion to the lateral contact is formed, as shown by block 1760.

In some embodiments, the method 1700B continues when a gate contact connecting a gate region to the BEOL is formed, as shown by block 1770.

In some embodiments, the method 1700B continues when a dielectric isolation layer covering the gate contact is formed, as shown by block 1780. A portion of the dielectric isolation layer is connected to the lateral contact.

In one aspect, the method and structures described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:
a first source/drain region;
a first contact over the first source/drain region, wherein portions of the first contact are recessed;
a second source/drain region;
a lateral contact connecting the second source/drain region to a back end of line (BEOL),
wherein the lateral contact overlaps with the recessed portions of the first contact, and
wherein the first source/drain region is formed over the second source/drain region; and
a second contact comprising:
a first portion over the second source/drain region; and
a second portion connecting the first portion to the lateral contact.

2. The semiconductor device of claim 1, wherein the lateral contact is located above the first and second source/drain regions.

3. The semiconductor device of claim 1, wherein the first source/drain region is located on a first transistor and the second source/drain region is located on a second transistor, and wherein the first transistor is stacked over the second transistor.

4. The semiconductor device of claim 1, further comprising:
a gate contact connecting a gate region to the BEOL; and
a dielectric isolation layer covering the gate contact.

5. The semiconductor device of claim 4, wherein a location of the lateral contact is offset from a centerline of the second source/drain region away from the gate region.

6. The semiconductor device of claim 4, wherein the gate contact passes through the lateral contact and un-recessed portions of the first contact.

7. The semiconductor device of claim 6, wherein the dielectric isolation layer isolates the gate contact from direct contact with the lateral contact and the first contact.

8. The semiconductor device of claim 5, wherein a portion of the dielectric isolation layer is connected to the lateral contact.

9. The semiconductor device of claim 8, wherein the first contact and the second contact are isolated by an interlayer dielectric (ILD).

10. A method for forming a semiconductor device, the method comprising:
forming a first source/drain region;
forming a first contact over the first source/drain region, wherein portions of the first contact are recessed;
forming a second source/drain region;
forming a lateral contact connecting the second source/drain region to a back end of line (BEOL),
wherein the lateral contact overlaps with the recessed portions of the first contact, and wherein the first source/drain region is formed over the second source/drain region; and
forming a second contact, wherein the forming the second contact comprises:
forming a first portion over the second source/drain region; and
forming a second portion connecting the first portion to the lateral contact.

11. The method of claim 10, wherein the lateral contact is located above the first and second source/drain regions.

12. The method of claim 10, wherein the first source/drain region is located on a first transistor and the second source/drain region is located on a second transistor, and wherein the first transistor is stacked over the second transistor.

13. The method of claim 10, further comprising:
forming a gate contact connecting a gate region to the BEOL; and
forming a dielectric isolation layer covering the gate contact.

14. The method of claim 13, wherein a location of the lateral contact is offset from a centerline of the second source/drain region away from the gate region.

15. The method of claim 13, further comprising passing the gate contact through the lateral contact and un-recessed portions of the first contact.

16. The method of claim 13, further comprising isolating the gate contact from direct contact with the lateral contact and the first contact by the dielectric isolation layer.

17. The method of claim 16, further comprising isolating the first contact and the second contact by an interlayer dielectric (ILD), wherein a portion of the dielectric isolation layer is connected to the lateral contact.

18. A semiconductor device, comprising:
a source/drain contact connecting a source/drain region to a back end of line (BEOL);
a gate contact connecting a gate region to the BEOL; and
a lateral contact, wherein the gate contact is isolated from direct contact with the lateral contact through a dielectric isolation layer formed over the gate contact.

* * * * *